United States Patent
Ito et al.

(10) Patent No.: US 7,501,332 B2
(45) Date of Patent: Mar. 10, 2009

(54) DOPING METHOD AND MANUFACTURING METHOD FOR A SEMICONDUCTOR DEVICE

(75) Inventors: Takayuki Ito, Kawasaki (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 11/097,259

(22) Filed: Apr. 4, 2005

(65) Prior Publication Data

US 2005/0227463 A1 Oct. 13, 2005

(30) Foreign Application Priority Data

Apr. 5, 2004 (JP) .............................. P2004-111368

(51) Int. Cl.
*H01L 21/425* (2006.01)
(52) U.S. Cl. .................... 438/528; 438/513; 438/918; 438/964; 257/E21.435
(58) Field of Classification Search .......... 257/E21.435; 438/510, 513, 527–529, 798, 918, 964, 546
See application file for complete search history.

(56) References Cited

U.S. PATENT DOCUMENTS

| 5,145,794 | A | * | 9/1992 | Kase et al. | .................. | 438/515 |
| 5,561,072 | A | * | 10/1996 | Saito | ............................ | 438/513 |
| 5,866,472 | A | * | 2/1999 | Moslehi | ..................... | 438/513 |
| 6,037,204 | A | * | 3/2000 | Chang et al. | ................. | 438/231 |
| 6,225,176 | B1 | * | 5/2001 | Yu | .............................. | 438/305 |
| 6,380,044 | B1 | * | 4/2002 | Talwar et al. | ............... | 438/308 |
| 6,713,819 | B1 | * | 3/2004 | En et al. | ..................... | 257/369 |
| 6,734,099 | B2 | * | 5/2004 | Zhao et al. | .................. | 438/656 |
| 2002/0187614 | A1 | * | 12/2002 | Downey | ..................... | 438/407 |
| 2003/0096490 | A1 | * | 5/2003 | Borland et al. | ............. | 438/513 |
| 2003/0116090 | A1 | * | 6/2003 | Chu et al. | ................ | 118/723 E |
| 2003/0193066 | A1 |   | 10/2003 | Ito et al. | | |
| 2004/0018702 | A1 | * | 1/2004 | Ito et al. | ..................... | 438/530 |
| 2004/0087120 | A1 | * | 5/2004 | Feudel et al. | .............. | 438/525 |
| 2004/0097057 | A1 | * | 5/2004 | Meyyappan | ................ | 438/514 |

FOREIGN PATENT DOCUMENTS

JP 07-142421 6/1995

(Continued)

OTHER PUBLICATIONS

Pearton, S. J., at al. Appl. Phys. A. vol. 43 (1987): pp. 153-195.*

(Continued)

*Primary Examiner*—Douglas M Menz
*Assistant Examiner*—Matthew W Such
(74) *Attorney, Agent, or Firm*—Finnegan, Henderson, Farabow, Garrett & Dunner, L.L.P.

(57) ABSTRACT

A doping method includes implanting first impurity ions into a semiconductor substrate, so as to form a damaged region in the vicinity of a surface of the semiconductor substrate, the first impurity ions not contributing to electric conductivity; implanting second impurity ions into the semiconductor substrate through the damaged region, the second impurity ions having an atomic weight larger than the first impurity ions and contributing to the electric conductivity; and heating the surface of the semiconductor substrate with a light having a pulse width of about 0.1 ms to about 100 ms, so as to activate the second impurity ions.

18 Claims, 17 Drawing Sheets

FOREIGN PATENT DOCUMENTS

| | | |
|---|---|---|
| JP | 08-148424 | 6/1996 |
| JP | 2000-082678 | 3/2000 |
| JP | 2002-141298 | 5/2002 |

OTHER PUBLICATIONS

Pearton, S. J., et al. Appl. Phys. A. vol. 43 (1987): pp. 153-195.*
Pearton, S. J., et al. Appl. Phys. A. vol. 43 (1987): pp. 153-197.*
Moller, W., et al. Current Science. vol. 83, No. 3 (2002): pp. 237-253.*
Jones, E.C., et al. JPN. J. Appl. Phys. vol. 35 (1996): pp. 1027-1036.*
Sasaki, Y., et al. "B2H6 Plasma Doping with In-Situ He Pre-Amorphization." IEEE Digest of Technical Papers. 2004 Symposium on VLSI Technology, 2004. (Jun. 15-17, 2004): pp. 180-181.*
Sasaki, Y., et al. "New Method of Plasma Doping with In-Situ Helium Pre-Amorphization." Nuc. Instr. Meth. Phys. Res. B, vol. 237, (2005): pp. 41-45.*
Mizuno, B., et al. "Plasma Doping." IEEE Proceedings. 7th International Conference on Solid-State and Integrated Circuits Technology, 2004, vol. 1. (Oct. 18-21, 2004): pp. 423-427.*
Qian, C. and Terreault, B. "Blistering of Silicon Crystals by Low keV Hydrogen and Helium Ions." J. Appl. Phys., vol. 90, No. 10. (Nov. 15, 2001): pp. 5152-5158.*
Sasaki, Y., et al. "B2H6 Plasma Doping with In-Situ He Pre-Amorphization." IEEE Digest of Technical Papers. 2004 Symposium on VLSI Technology, 2004. (Jun. 15-17, 2004): pp. 180-181.*

* cited by examiner

DOPING METHOD AND MANUFACTURING METHOD FOR A SEMICONDUCTOR DEVICE

CROSS REFERENCE TO RELATED APPLICATIONS AND INCORPORATION BY REFERENCE

This application is based upon and claims the benefit of priority from prior Japanese Patent Application P2004-111368 filed on Apr. 5, 2004; the entire contents of which are incorporated by reference herein.

BACKGROUND OF THE INVENTION

1. Field of the Invention

The present invention relates to a doping method, and particularly to a doping method by annealing with a high intensity light source, and a manufacturing method for a semiconductor device.

2. Description of the Related Art

It is possible to achieve improvements in a semiconductor device performance of a large scale integration (LSI) and the like by increasing integration, or to put it more plainly, by miniaturization of the elements that build up a semiconductor device. Thus, LSIs are increasingly large-scale while miniaturization of elements such as metal-oxide-semiconductor (MOS) transistors is being taken to a whole new level. Along with (MOS) transistors is being taken to a whole new level. Along with the miniaturization of elements, parasitic resistance and short channel effects on MOS transistors and the like, are increasing. Thus, there is increased importance placed on the formation of low resistance layers and shallow pn junctions.

For forming a shallow pn junction with a thickness of or below twenty nm, a thin impurity doped region is formed using ion implantation in a semiconductor substrate, with low acceleration energy. The impurities doped in the semiconductor substrate are activated by annealing, thus forming a shallow impurity diffusion region.

However, the diffusion coefficients of p-type impurity atoms such as boron (B), and n-type impurity atoms such as phosphorus (P) or arsenic (As), in the crystal of the silicon (Si) substrate, are large. In the processing time needed to perform rapid thermal annealing (RTA) using current halogen lamps, impurities diffuse to both the interior and exterior of a semiconductor substrate. As a result, it is impossible to form a shallow impurity diffusion region having a high concentration of impurities on the semiconductor substrate. Also, it becomes difficult to activate a high concentration of impurities if the temperature of the RTA process is decreased in order to control the diffusion of the impurities. Because of such difficulties it is difficult to form a shallow impurity diffusion region having low resistance and a high concentration of activated impurities.

In recent years, a flash lamp annealing method using a xenon (Xe) flash lamp and the like, which can instantly supply the energy essential to impurity activation, is being tested as a solution to the RTA problem. A Xe flash lamp has a quartz glass tube filled with Xe gas in which electrical charges stored in capacitors, and the like, are instantaneously discharged. As a result, it is possible to emit a high intensity white light within a range of several hundred μs to several hundred ms. It is possible to attain the heat energy required for impurity activation in the instantaneous heating of a semiconductor substrate absorbing flash lamp light. Therefore, it is possible to activate a high concentration of impurities while leaving the concentration profile of the impurities implanted into the semiconductor substrate virtually unchanged.

However, in a flash lamp annealing method, there is a problem of a decrease in thermal efficiency due to light of the flash lamp being reflected off of the surface of a semiconductor substrate. Because of this drop in thermal efficiency, it is impossible to sufficiently activate impurities. An irradiation energy density of 30 J/cm$^2$ or more is needed to activate a high concentration of impurities. Semiconductor devices have various materials arranged in fine patterns that are often uneven and irregular. When high intensity white flash lamp light is irradiated onto a semiconductor substrate, there are differences in refractive indices because of the various materials included in elements of a semiconductor device. Thus, incident flash lamp light is refracted and light interfere occurs inside the semiconductor substrate. In a case in which irradiation energy density of flash lamp light is large, there is a concern that hot spots may be formed. Such hot spots arise when flash lamp light undergoes interference and concentrates in spots within a semiconductor substrate. Thermal stresses between various materials used in a semiconductor device may be generated due to differences in thermal properties such as heating efficiency, specific heat, thermal conductivity, and coefficient of thermal expansion. As a result, the thermal stress induced within a semiconductor substrate may increase. Crystal defects, such as slip and dislocation, caused by thermal stress inside a semiconductor substrate may be generated, so as to decrease the production yield rate.

In an attempt to increase an activated concentration of impurities, there is a method for increasing the solid solubility of impurities, in which a surface layer of a semiconductor substrate is amorphized by ion implantation using a group IV element, such as Si and germanium (Ge). However, crystal defects caused by ion implantation of group IV element will remain after activation annealing. Therefore, ion implantation of group IV element may be a cause for increasing leakage current of a pn junction, and off-state current of a transistor. Thus, in current flash lamp annealing methods, although it may be possible to form an impurity diffusion layer having a shallow pn junction, it is difficult to form a low resistance diffused layer having no crystal defects.

SUMMARY OF THE INVENTION

A first aspect of the present invention inheres in a doping method including implanting first impurity ions into a semiconductor substrate, so as to form a damaged region in the vicinity of a surface of the semiconductor substrate, the first impurity ions not contributing to electric conductivity; implanting second impurity ions into the semiconductor substrate through the damaged region, the second impurity ions having an atomic weight larger than the first impurity ions and contributing to the electric conductivity; and heating the surface of the semiconductor substrate with a light having a pulse width of about 0.1 ms to about 100 ms, so as to activate the second impurity ions.

A second aspect of the present invention inheres in a manufacturing method for a semiconductor device including forming an isolation region on a semiconductor substrate to separate an element region; depositing a gate insulating film on top of the element region; forming a gate electrode on top of the gate insulating film; implanting first impurity ions using the gate electrode as a mask, so as to form damaged regions in the vicinity of a surface of the semiconductor substrate between the gate insulating film and the isolation region, the first impurity ions not contributing to conductivity; implanting second impurity ions into the semiconductor substrate through the damaged regions, the second impurity having an atomic weight larger than the first impurity ions and contributing to the electric conductivity; and heating the surface of the semiconductor substrate with a light having a pulse width of from 0.1 milliseconds to 100 milliseconds, so as to form source-drain regions by activating the second impurity ions.

DETAILED DESCRIPTION OF THE INVENTION

Figure 1:
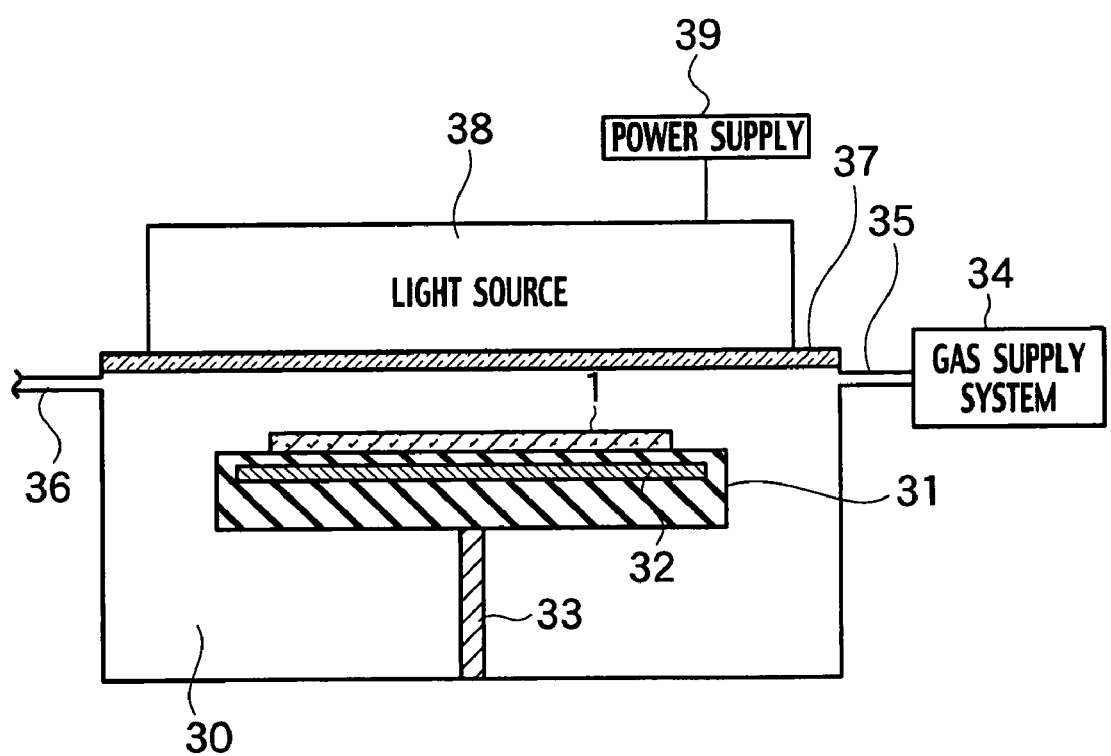
FIG. 1 is a schematic view showing an example of an annealing apparatus used in a doping method according to the embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

An annealing apparatus according to an embodiment of the present invention, as shown in FIG. 1, includes a processing chamber 30, a susceptor 31, an intake pipe 35, an exhaust pipe 36, a transparent window 37, and a light source 38. An annealing process is performed in the processing chamber 30 to activate impurity ions implanted into a semiconductor substrate 1, such as Si. The semiconductor substrate 1 is placed on top of the susceptor 31 which is disposed inside of the processing chamber 30. The intake pipe 35 feeds an ambient gas to the processing chamber 30. The exhaust pipe 36 vents the ambient gas from the processing chamber 30. The transparent window 37 is disposed on top of the processing chamber 30 facing the susceptor 31. The light source 38 irradiates a pulse of light through the transparent window 37 to a surface of the semiconductor substrate 1.

The processing chamber 30 is fabricated from a metal such as stainless steel, for example. The susceptor 31, on which the semiconductor substrate 1 is placed, is located on the top of a support shaft 33 installed perpendicular to the bottom of the processing chamber 11. Aluminum nitride (AlN), ceramics, or quartz glass may be used as the susceptor 31. As the susceptor 31, stainless steel, of which a surface is protected by AlN, ceramics, or quartz glass, can be used. A heat source 32 used to heat the semiconductor substrate 1 is provided in the susceptor 31. An element such as a heat lamp or an embedded metallic heater of nichrome wire are used as the heat source 32. Temperature of the heat source 32 is controlled by a control system (not shown) provided outside of the processing chamber 30. The control system enables the susceptor 31 to rotate by use of the support shaft 33. A gas supply system 34 including a gas source that supplies an inert gas during the annealing of the semiconductor substrate 1 is connected to the intake pipe 35.

The light source 38, such as a flash lamp, is disposed on top of the processing chamber 30 to heat the surface of the semiconductor substrate 1 by irradiating a pulse of light through the transparent window 37. The transparent window 37 may be fused silica and the like. A source power supply 39, such as a pulse power supply, is connected to the light source 38 to drive the light source 38 in an extremely short pulse. The transparent window 37 transmits the light irradiated from the light source 38 to the semiconductor substrate 1, while maintaining an airtight barrier separating the processing chamber 30 from the light source 38.

Figure 2:
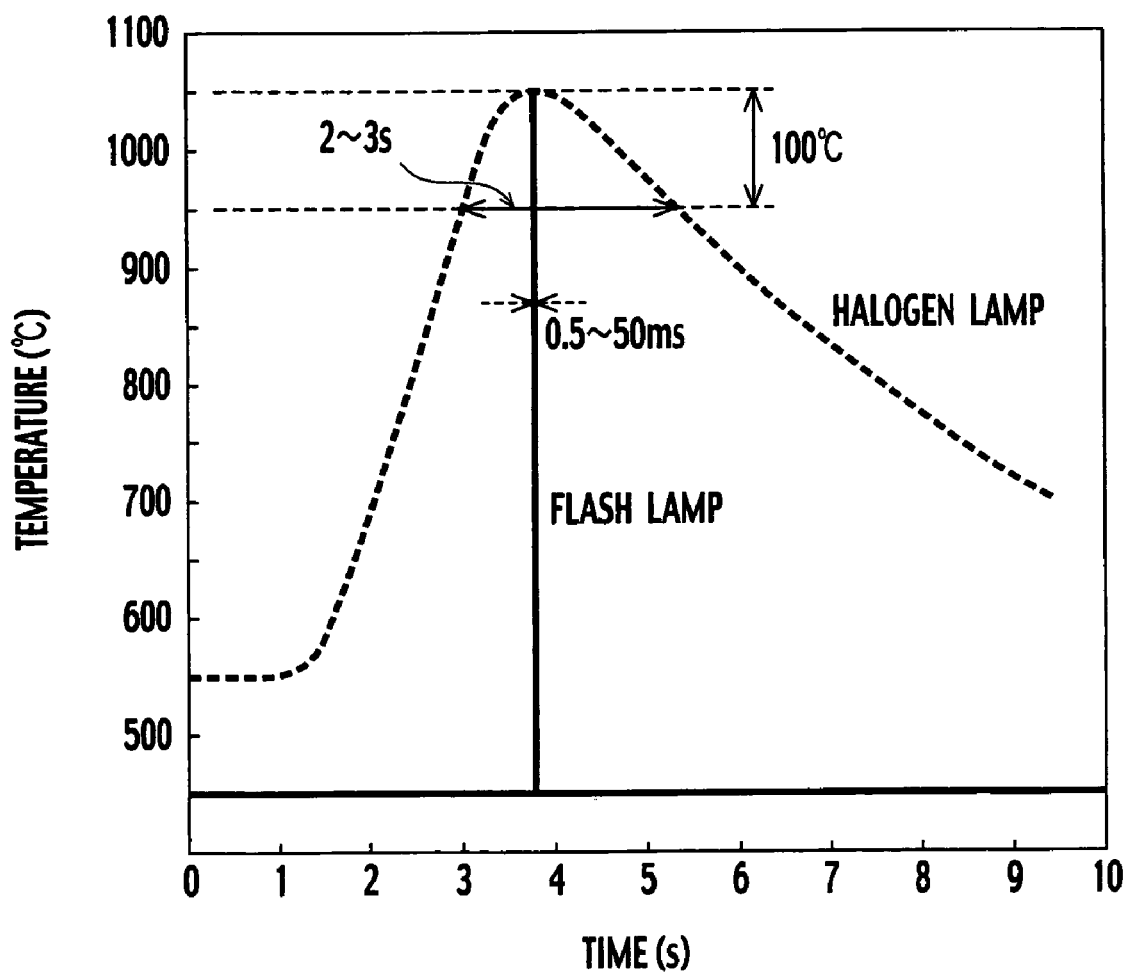
FIG. 2 is a diagram illustrating an example of the heating characteristics of a light source of the annealing apparatus according to the embodiment of the present invention.
Figure 3:
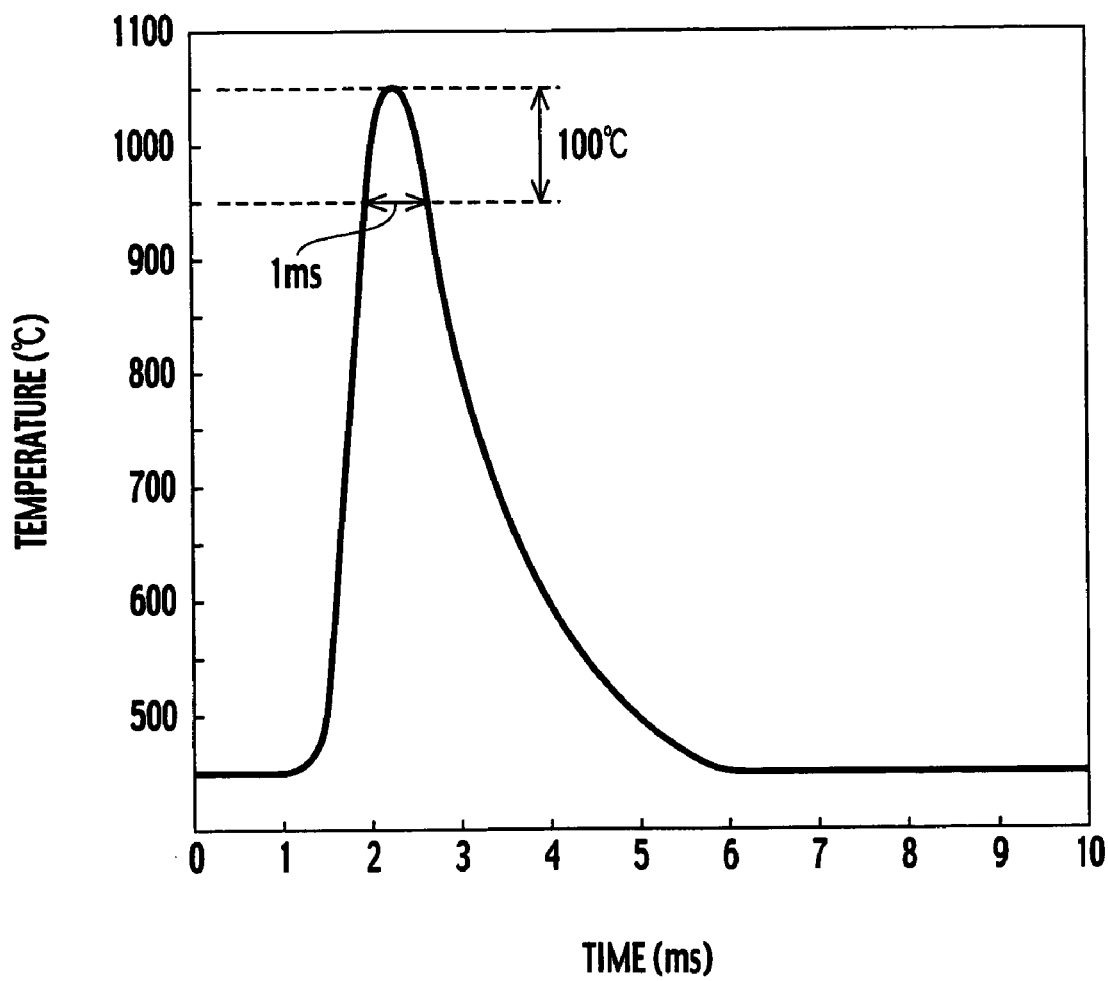
FIG. 3 is a diagram illustrating an example of the heating characteristics of the light source of the annealing apparatus according to the embodiment of the present invention.

A heating profile of the Xe flash lamp used for the light source 38 provides precipitous increases and decreases in temperature compared to an infrared lamp, such as a halogen lamp used in RTA processes, as shown in FIG. 2. The luminous spectrum of the Xe flash lamp of the light source 38 is close to white light, and has a main peak intensity wavelength of from about 400 nm to about 500 nm. The surface temperature of the semiconductor substrate 1 is measured by a high speed pyrometer.

In a halogen lamp, it takes about 10 s or more, for example, about 15 s seconds, to increase and decrease the temperature from about 550° C. to about 1050° C. Moreover, it requires about 2 s to about 3 s to increase and decrease with about 100° C. between about 950° C. and about 1050° C. On the other hand, in the flash lamp, it takes about 0.1 ms to about 100 ms to increase and decrease the temperature from about 450° C. to about 1200° C., and more desirably from about 0.5 ms to about 50 ms. In a period of time less than about 0.1 ms to increase and decrease the temperature, since the highest temperature reached during heating will be less than about 900° C., the impurity ions implanted to the semiconductor substrate 1 may not be sufficiently activated. In a period of time exceeding about 100 ms, the highest temperature reached will exceed about 1400° C. If the semiconductor substrate 1 is heated to exceed 1400° C., the diffusion of the implanted impurities is enhanced. As a result, it becomes difficult to form a shallow pn junction near the surface of the semiconductor substrate 1, because of diffusion of impurity ions implanted in the semiconductor substrate 1.

With a flash lamp light according to the embodiment of the present invention, a thermal elevation time for temperatures between about 450° C. to about 1050° C. is about 5 ms. Additionally, a thermal elevation time for temperatures between about 950° C. to about 1050° C. is about 1 ms. Therefore, according to the embodiment of the present invention, it is possible to activate impurity ions implanted into the semiconductor substrate 1 at a high temperature such as about 900° C. or more in an extremely short period of time. As a result, impurity diffusion arising from activation annealing can be limited to a length of about 5 nm or less. Thus, it is possible to form a shallow pn junction.

Further, during activation annealing, the semiconductor substrate 1, on top of the susceptor 31, is preheated by the heat source 32 to a temperature between about 300° C. and about 600° C., and desirably between about 400° C. and about 500° C. If a pre-heating temperature is less than 300° C., there are cases in which the highest temperature reached, during annealing, will be only 900° C. or less. If a pre-heating temperature exceeds about 600° C., there are cases in which the highest temperature reached, during annealing, will exceed about 1400° C.

In a doping method according to the embodiment of the present invention, first impurity ions are implanted into a semiconductor substrate 1, so as to form a damaged region in the vicinity of a surface of the semiconductor substrate 1. The first impurity ions do not contribute to electric conductivity of the semiconductor substrate 1. Second impurity ions having an atomic weight larger than the first impurity ions are implanted into the semiconductor substrate 1 through the damaged region so as to form an impurity implanted region. The second impurity ions contribute to the electric conductivity of the semiconductor substrate 1. Afterward, the surface of the semiconductor substrate is heated by the flash lamp with a pulse width in a range of about 0.1 ms to 100 ms so as to activate the second impurity ions. Ions of impurity atoms having a shallow energy level in relation to a valance band or a conduction band within a band gap in a band structure of a semiconductor crystal are used as the second impurity ions. For example, a p-type impurity atom such as B, and an n-type impurity atom such as P or As are used for a Si crystal.

A doping method according to the embodiment of the present invention will be described using an example of a manufacturing method for a pMOS transistor as a semiconductor device.

Figure 4:
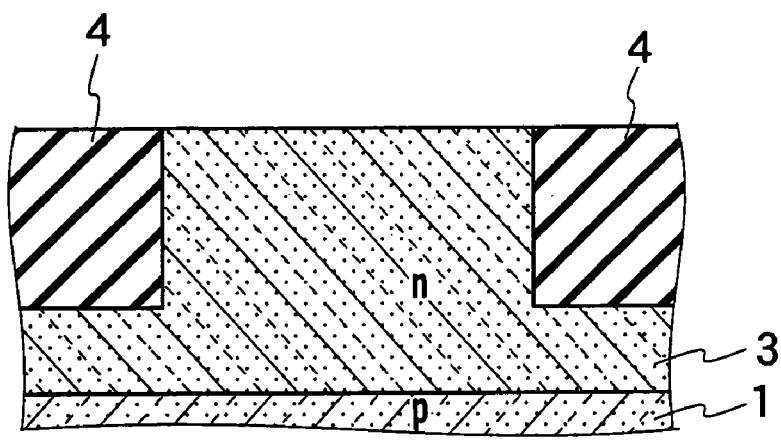
FIGS. 4 to 8 are cross section views showing an example of a manufacturing process of a semiconductor device used in a description of a doping method according to the embodiment of the present invention.

Ions of an n-type impurity atom of a group V element, such as As, are implanted into a p-type semiconductor substrate 1 of Si, so as to form an n-well 3. By photolithography, reactive ion etching (RIE) and the like, a trench is formed on a periphery of the n-well 3. By low pressure chemical vapor deposition (LPCVD) and the like, an insulating film, such as silicon oxide ($SiO_2$) is deposited so as to bury the trench. Afterward, the insulating film deposited on the surface of the n-well 3 of the semiconductor substrate 1 is removed by chemical mechanical polishing (CMP) and the like, so as to form a shallow trench isolation (STI) 4 as an isolation region, as shown in FIG. 4. An element region is formed in between the STI 4.

Figure 5:
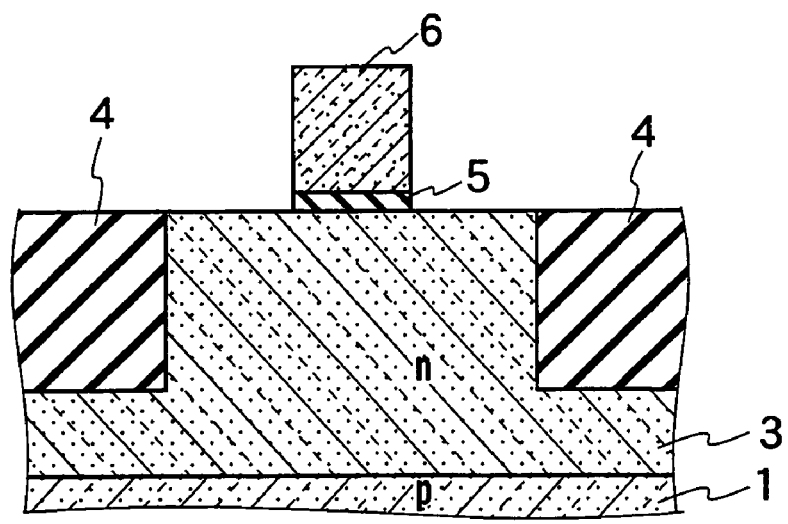

An insulating film, such as thermal oxide, is formed on the surface of the element region of the semiconductor substrate 1. A polycrystalline Si (poly-Si hereinafter) film is deposited on top of the insulating film by LPCVD and the like. The poly-Si film and the insulating film are selectively removed by photolithography, RIE and the like, so as to form a gate electrode 6 and a gate insulating film 5, as shown in FIG. 5.

Figure 6:
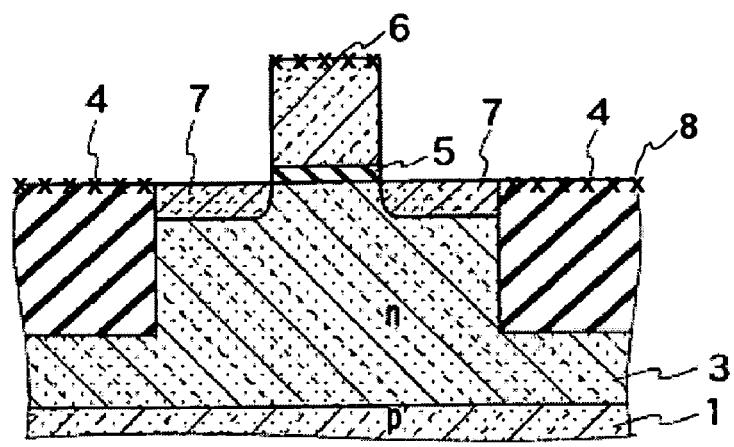

Using the gate electrode 6 as a mask, first impurity ions such as helium (He) are implanted into an exposed surface of the semiconductor substrate 1 by plasma source ion implantation. He ions have an atomic weight smaller than second impurity ions such as B. The He ions do not contribute to electric conductivity in the semiconductor substrate. The B ions contribute to electric conductivity of the semiconductor substrate 1. In the plasma source ion implantation, a He gas fed into a chamber of a plasma source ion implanter under low pressure, is activated by high frequency electric power to generate a plasma. In the chamber, the semiconductor substrate is placed on a stage charged with a negative high pulse voltage. With respect to the generated plasma, an ion sheath is formed in the periphery surrounding the semiconductor substrate 1 on the stage. He ions within the plasma are accelerated at an acceleration energy of about 100 eV, so as to implant in the semiconductor substrate 1 with an implant dose of about $1 \times 10^{15}$ cm$^{-2}$. As a result, amorphized damaged regions 7 are formed between both ends of the gate insulating film 5 and the STI 4, at a depth of about 15 nm or less from the surface of the semiconductor substrate 1, and desirably at a depth of about 10 nm. A peak concentration of the implanted He is in a range of about $1 \times 10^{19}$ cm$^{-3}$ to $1 \times 10^{21}$ cm$^{-3}$. In the process of the plasma source ion implantation of He, surfaces of the gate electrode 6, the STI 4, and the semiconductor substrate 1, which are exposed to the plasma, are sputtered so as to form a fine irregularity on the surfaces. A period of the formed irregularity is small compared to pattern periods of the gate electrode 6 and the STI 4. For example, the pattern periods are in a range of about 100 nm to about 1000 nm, which is close to the peak wavelength of the flash lamp light of about 400 nm to about 500 nm. On the other hand, the period of the irregularity is less than a tenth of the peak wavelength of the flash lamp light. The fine irregularity is shown in FIG. 6 as feature 8 on the damaged region 7, the STI 4, and the gate electrode 6 as a series of 'x' characters. For simplicity, the fine irregularity 8 is not shown in subsequent figures.

Figure 7:
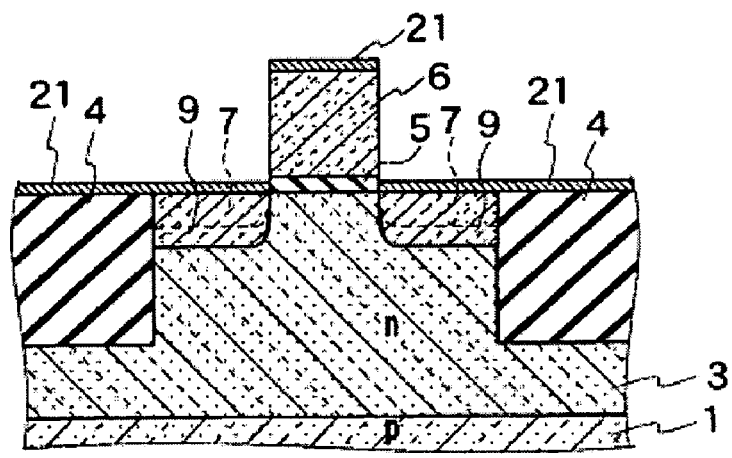

A boron hydride gas including B, such as diborane ($B_2H_6$) or decaborane ($B_{10}H_{14}$) is fed into the chamber of the plasma source ion implanter, in place of the He gas. Using the gate electrode 6 as a mask, B ions are implanted through the damaged regions 7 formed on the semiconductor substrate 1 at an acceleration energy of about 200 eV and an implant dose of about $1 \times 10^{19}$ cm$^{-3}$ by plasma source ion implantation. The plasma source ion implantation of B forms impurity implanted regions 9 between both ends of the gate insulating film 5 and the STI 4 at a depth of about 15 nm from the surface of the semiconductor substrate 1, as shown in FIG. 7. Additionally, an impurity layer 21 of deposited B is formed on the surfaces of the semiconductor substrate 1, the gate electrode 6 and the STI 4.

Figure 8:
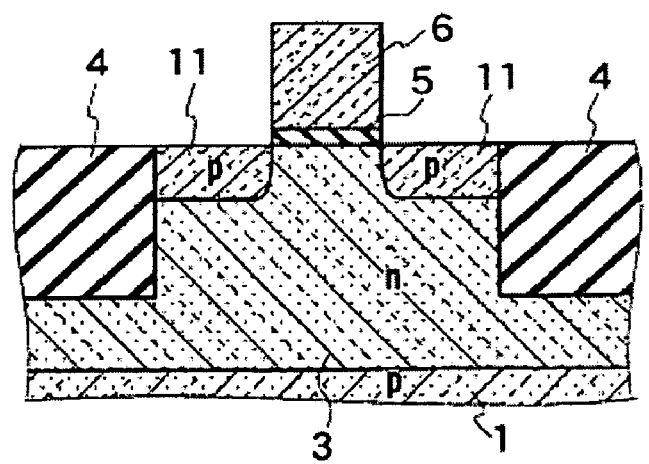

The semiconductor substrate 1 is placed on top of the susceptor 31 of the annealing apparatus shown in FIG. 1. In activation annealing, the semiconductor substrate 1 is preheated to about 450° C., for example, from a bottom surface of the semiconductor substrate 1 by the heat source 32 of the susceptor 31. The surface of the semiconductor substrate 1 is irradiated by a flash lamp light from the light source 38 with a pulse width of about 1 ms and an irradiation energy density of about 25 J/cm$^2$, while maintaining the pre-heating temperature of about 450° C. By activation annealing, the B ions implanted into the impurity implanted regions 9 reside in substitutional lattice sites to be activated, during re-crystallization of the impurity implanted regions 9 and the damaged regions 7. As a result, p-type extension regions 11 are formed between both ends of the gate insulating film 5 and the STI 4, as shown in FIG. 8. Further, a part of the impurity layer 21 that has been deposited on the surfaces of the semiconductor substrate 1, the gate electrode 6, and the STI 4, will vaporize or diffuse into the extension regions 11 due to activation annealing. The impurity layer 21 remaining on the surfaces may be removed by wet or dry etching and the like.

In a doping method according to the embodiment of the present invention, the amorphized damaged regions 7 are formed in the step of plasma source ion implantation of He, as shown in FIG. 6. Additionally, the fine irregularity is formed on the surfaces of the impurity implanted regions 9, the gate electrode 6, and the STI 4, by sputtering, in the plasma source ion implantation. Furthermore, the impurity layer 21 is deposited on the surfaces of the impurity implanted regions 9, the gate electrode 6, and the STI 4. The absorption coefficient of the damaged regions 7 relevant to the flash lamp light may be increased compared with a single crystal Si substrate. In addition, because the impurity layer 21 is deposited on the surfaces of the impurity implanted regions 9, the gate electrode 6, and the STI 4, each having different materials, differences in flash lamp light absorption efficiency of the different materials is more even.

Furthermore, the fine irregularity formed on the surfaces of the impurity implanted regions 9, the gate electrode 6, and the STI 4, have a pitch shorter than repeating patterns of the gate electrode 6 and the STI 4. Incident light from the flash lamp passing through the fine irregularity is scattered in random directions throughout the interior of the impurity implanted regions 9, the gate electrode 6, and the STI 4. Thus, the absorption coefficient of the impurity implanted regions 9 relevant to the flash lamp light is increased.

In activation annealing of the impurity ions implanted into the impurity implanted regions 9, the irradiation energy can be reduced to about 25 J/cm$^2$, which is less than a normally required irradiation energy density of about 30 J/cm$^2$ for a Si substrate. Due to the reduction in the irradiation energy, thermal stress arising from differences between thermal properties of different materials is suppressed. It is also possible to suppress formation of hotspots arising from interference of the flash lamp light incident to the semiconductor substrate 1. As a result, by suppressing crystal defects in the semiconductor substrate 1, it may be possible to form a shallow pn junction.

Further, in the description set forth above, the damaged regions 7 are described as being amorphized. However, the damaged regions 7 do not have to be entirely amorphized. For example, it is acceptable for the damaged regions 7 to be partially amorphized, including a large amount of crystal defects. It is also acceptable for the damaged regions 7 to be even a single crystal layer including a large amount of crystal defects. The absorption coefficient for the flash lamp light may increase due to crystal defects.

Figure 9:
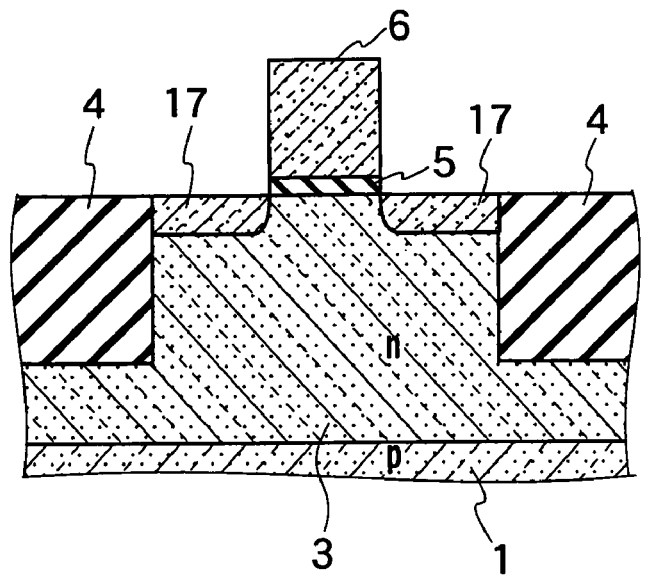
FIGS. 9 to 10 are cross section views showing another example of a manufacturing process of a semiconductor device used in a description of a doping method according to the embodiment of the present invention.
Figure 10:
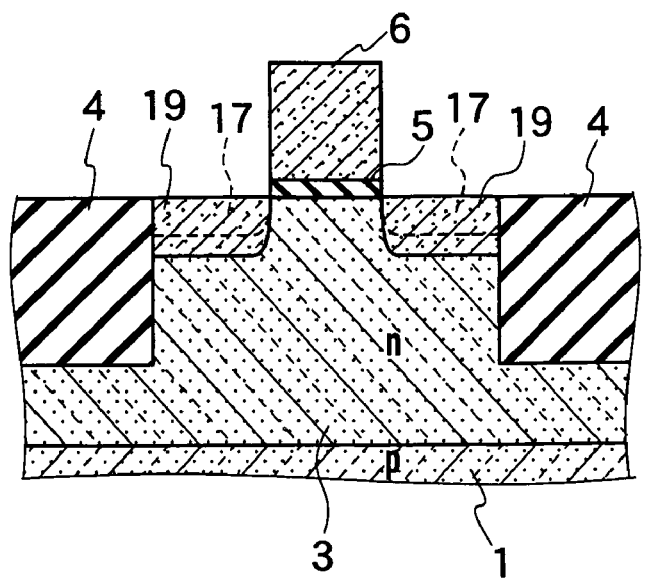

In the description of a doping method according to the embodiment of the present invention, the damaged regions 7 and the impurity implanted regions 9 are formed by plasma source ion implantation. However, it is also possible to form the damaged regions 7 and the impurity implanted regions 9 by common beam line ion implantation. For example, first impurity atoms, such as He, are converted into plasma in an ionization chamber of a beam line ion implanter. Using the gate electrode 6 as a mask, He ions are implanted, as shown in FIG. 9. The ion implantation condition for He is an acceleration energy of about 0.1 keV at an implant dose of about $1\times10^{15}$ cm$^{-2}$. The He ions are implanted at a depth of about 10 nm from a surface of the semiconductor substrate 1, at a concentration of about $1\times10^{19}$ cm$^{-3}$ to about $1\times10^{21}$ cm$^{-3}$, for example. As a result, amorphized damaged regions 17 are formed between both ends of the gate insulating film 5 and the STI 4, at a depth of about 10 nm from the surface of the semiconductor substrate 1. Continuously, second impurity atoms which are p-type impurity atoms of group III element, such as B, are ionized. Using the gate electrode 6 as a mask, B ions are implanted, as shown in FIG. 10. The ion implantation condition for B is an acceleration energy of about 0.2 keV with an implant dose of about $1\times10^{15}$ cm$^{-2}$. As a result, impurity implanted regions 19 are formed between both ends of the gate insulating film 5, and the STI 4, at a depth of about 15 nm from the surface of the semiconductor substrate 1.

The absorption coefficient for the flash lamp light is increased in the damaged regions 17 in the impurity implanted regions 19. Therefore, in activation annealing for the second impurity ions implanted in the impurity implanted regions 19, the irradiation energy can be reduced to 25 J/cm$^2$, which is small compared to a normally required irradiation energy density of 30 J/cm$^2$. Additionally, because the irradiation energy can be reduced to 25 J/cm$^2$, it is possible to suppress formation of hotspots arising from interference in the flash lamp light incident to the semiconductor substrate 1. Thus, even by beam line ion implantation, it may be possible to suppress generation of crystal defects in the semiconductor substrate 1, so as to form a shallow pn junction.

Figure 11:
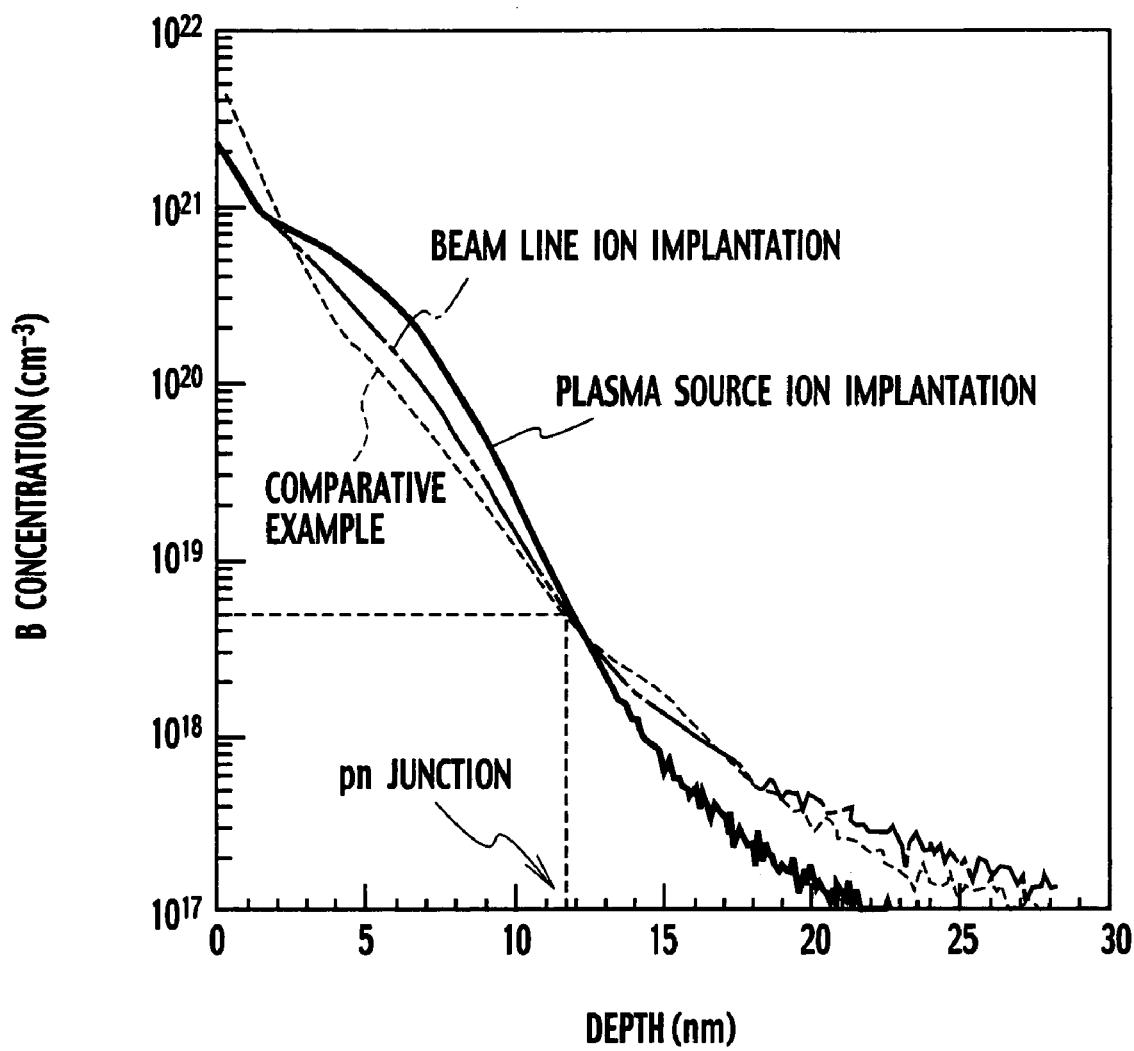
FIG. 11 is a graph illustrating a boron concentration distribution of an extension region after activation annealing, formed by a doping method according to the embodiment of the present invention.

In a PMOS transistor manufactured by a doping method according to the embodiment of the present invention, because the second impurity ions implanted into the impurity implanted regions 9 are sufficiently activated, sheet resistance of the extension regions 11 decreases. For example, the B concentration distribution of the extension regions 11 formed by plasma source ion implantation or beam line ion implantation is measured by secondary ion mass spectrometry (SIMS). The measured results show a pn junction of the extension regions 11 at a depth of about 12 nm, as shown in FIG. 11. Sheet resistance of the extension regions 11 is about 1200 Ω/sq. in a case in which the extension regions 11 have been formed by beam line ion implantation. On the other hand, in a case in which the extension regions 11 have been formed by plasma source ion implantation, it is possible to reduce sheet resistance of the extension regions 11 to 700 Ω/sq. Fluctuations in sheet resistance of a plurality of extension regions formed on the semiconductor substrate 1 can also be suppressed to below 1%. Thus, it is possible to improve element characteristics of a semiconductor device.

Further, in a comparative example shown in FIG. 11, a damaged region is formed by beam line ion implantation of germanium (Ge), which differs from the damaged regions 17 shown in FIG. 9 formed by ion implantation of He. The ion implantation condition for Ge is an acceleration energy of about 5 keV at a implant dose of about $1\times10^{14}$ cm$^{-2}$. Even in the comparative example, it is possible to achieve a similar depth of a pn junction compared to the extension regions 11 formed by a doping method according to the embodiment of the present invention, by activation annealing using a flash lamp light, as shown in FIG. 11. It is also possible to suppress the sheet resistance to about 900 Ω/sq. In the comparative example, by activation annealing using a flash lamp light, it is possible to form a shallow pn junction at a depth of about 15 nm or less.

Figure 12:
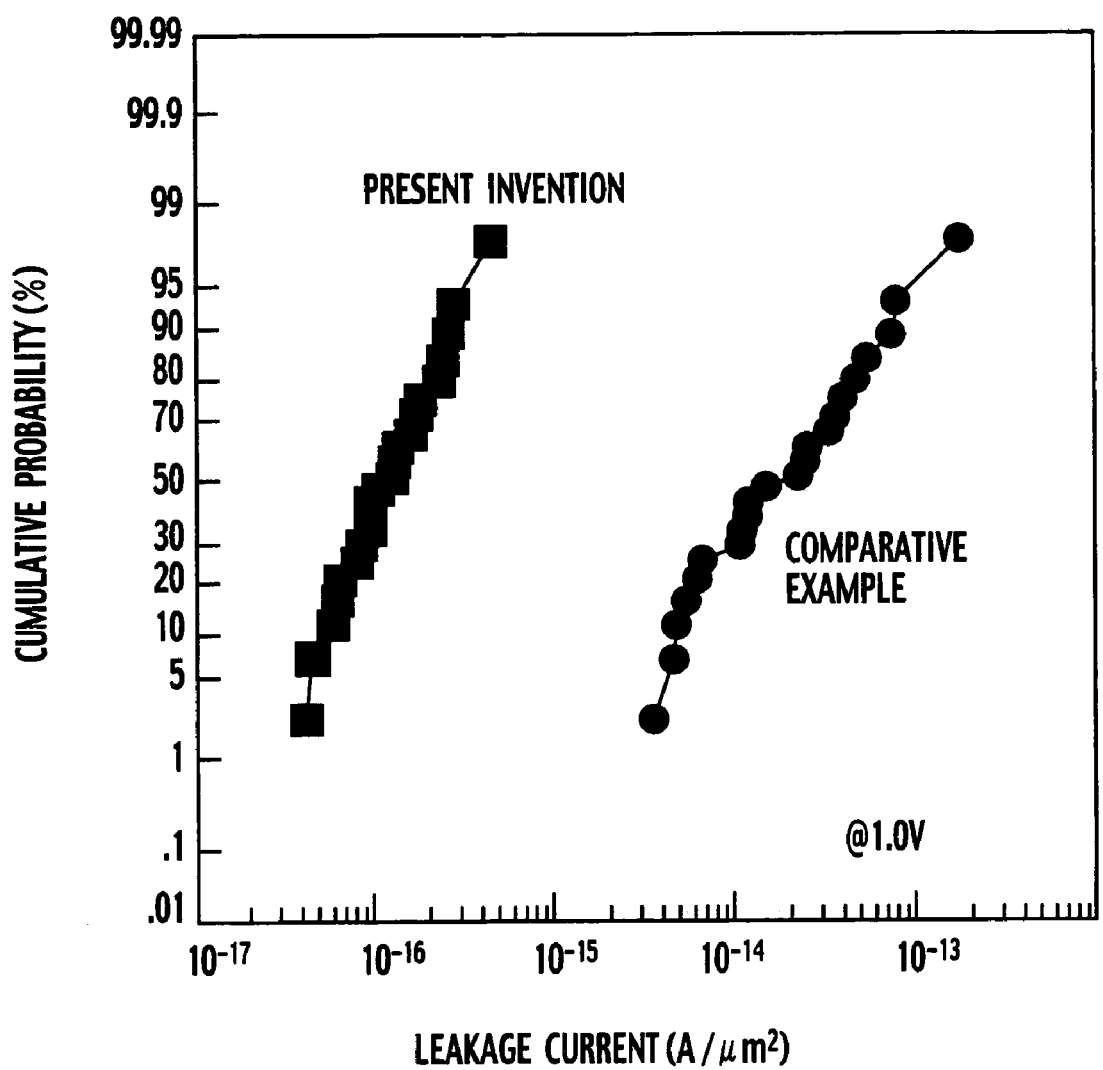
FIG. 12 is a graph illustrating cumulative probability of in-plane distribution of pn junction leak current of a pMOS transistor manufactured by a doping method according to the embodiment of the present invention.

In a pMOS transistor manufactured by a doping method according to the embodiment of the present invention, thermal stress arising from differences in thermal properties of different materials is suppressed, and crystal defects such as slip and shift may not form in the semiconductor substrate 1. FIG. 12 illustrates the cumulative probability of in-plane distribution of the leakage current of pn junctions of the extension regions 11 in a plurality of pMOS transistors fabricated in the semiconductor substrate 1. It is apparent that an excellent pn junction having less leakage current compared with the comparative example is formed in a PMOS transistor manufactured by a doping method according to the embodiment of the present invention.

Figure 13:
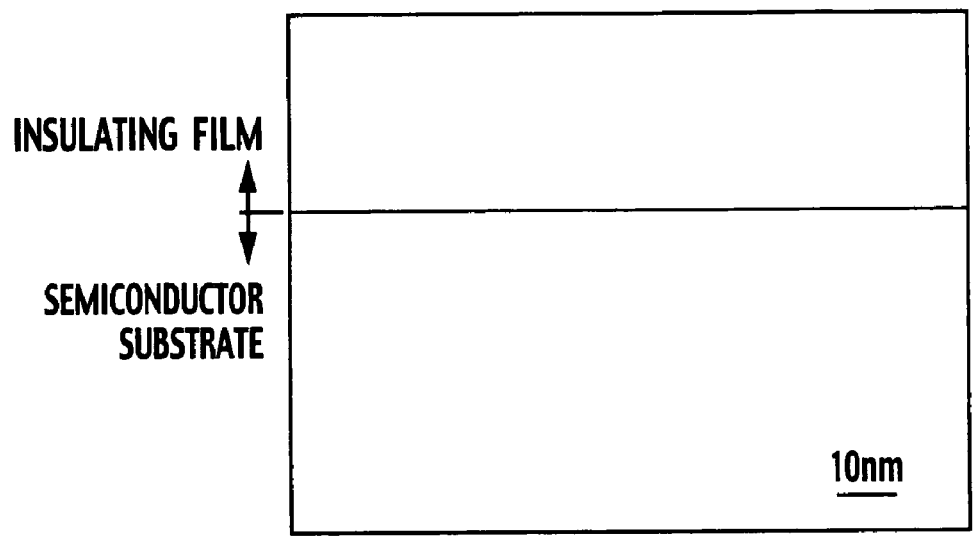
FIG. 13 is a view showing an example of a cross sectional TEM image of an extension region formed by a doping method according to the embodiment of the present invention.

For example, crystal defects near a pn junction of the extension regions 11 are evaluated by a transmission electron microscope (TEM). By observing a cross section TEM image of a semiconductor substrate corresponding to the extension regions 11 of a pMOS formed by a doping method according to the embodiment of the present invention, it can be affirmed that there is sufficient crystal recovery with no crystal defects, as shown in FIG. 13. Further, an insulating film for interconnects of the semiconductor device is formed on the surface of the semiconductor substrate 1.

Figure 14:
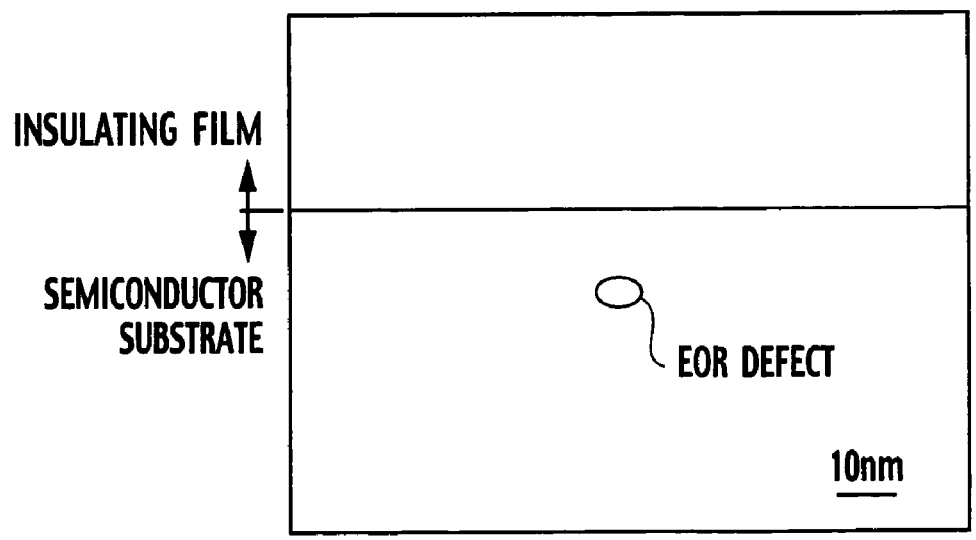
FIG. 14 is a view showing another example of a cross sectional TEM image of an extension region of a comparative example.

As shown in FIG. 14, in a cross section TEM image of an extension region of a comparative example, it is affirmed that an end of range (EOR) defect, which is a clustering crystal defect of a dislocation and the like, generated by Ion implantation of Ge, remains on a boundary of a pn junction of the extension region. Thus, in the comparative example, the crystal defects which can creates a current path in the boundary of the pn junction, is a cause of an increase of leakage current of the pn junction. In the comparative example, ion implantation of Ge which is the same group IV element as the Si semiconductor substrate 1, is used for forming a damaged region. Even if implanted Ge ions substitute lattice sites of the semiconductor substrate during re-crystallization of the damaged region by activation annealing, there will be no harmful influence on electric conductivity, so that low sheet resistance is achieved in the extension region of the comparative example.

The same results as with Ge will be achieved by ion implantation of Si, which is the constituent atom of the semiconductor substrate. However, compared to the He used in the embodiment of the present invention, the atomic weight of group IV elements such as Ge and Si is large. Thus, it is easy to cluster the crystal defects near the damaged region of the semiconductor substrate.

In the damaged regions 7 formed by ion implantation of He, since few crystal defects are generated near the damaged regions 7, the probability of formation of a clustering crystal defect is low. Further, the diffusion coefficient of He in a Si crystal in a temperature range of activation annealing, is about $10^6$ times larger than the second impurity atoms such as B, P, and As. The He ions diffuse to both the interior and exterior of the semiconductor substrate 1 during activation annealing, to prevent clustering of the first and second impurity ions near the extension regions 11. Therefore, in a doping method according to the embodiment of the present invention, it is possible to suppress generation of crystal defects in the semiconductor substrate 1, and to form a shallow pn junction.

In a doping method according to the embodiment of the present invention, the B concentration at a depth of 2 nm or more from the surface of the extension regions 11 can be increased compared to the comparative example, as shown in FIG. 11. Especially by plasma source ion implantation, the B concentration can be remarkably increased, and it is possible to increase the electrically active B concentration. Therefore, in the embodiment of the present invention, the extension regions 11 having a low resistance can be achieved by increasing the carrier concentration in the extension regions 11 formed by plasma source ion implantation. Compared to beam line ion implantation, in a case of plasma source ion implantation in which the boron hydride gas is converted to a plasma, the B ions are implanted so as to be distributed virtually in the shape of Gaussian distribution, within the impurity implanted regions 9. Therefore, clustering of the implanted impurity ions or crystal defects is suppressed. Point defects, such as vacancies or interstitial impurity atoms, are distributed uniformly throughout the impurity implanted regions 9. Even in the extremely short activation annealing time of the flash lamp light, the probability that the interstitial impurity atoms will move to a vicinity of the vacancies so as to combine with the vacancies, is high. Thus, point defects such as vacancies or interstitial impurity atoms may be eliminated, so as to activate the implanted impurity ions. Therefore, it is also possible to form a pn junction having a low resistance with high crystal quality and without crystal defects.

Figure 15:
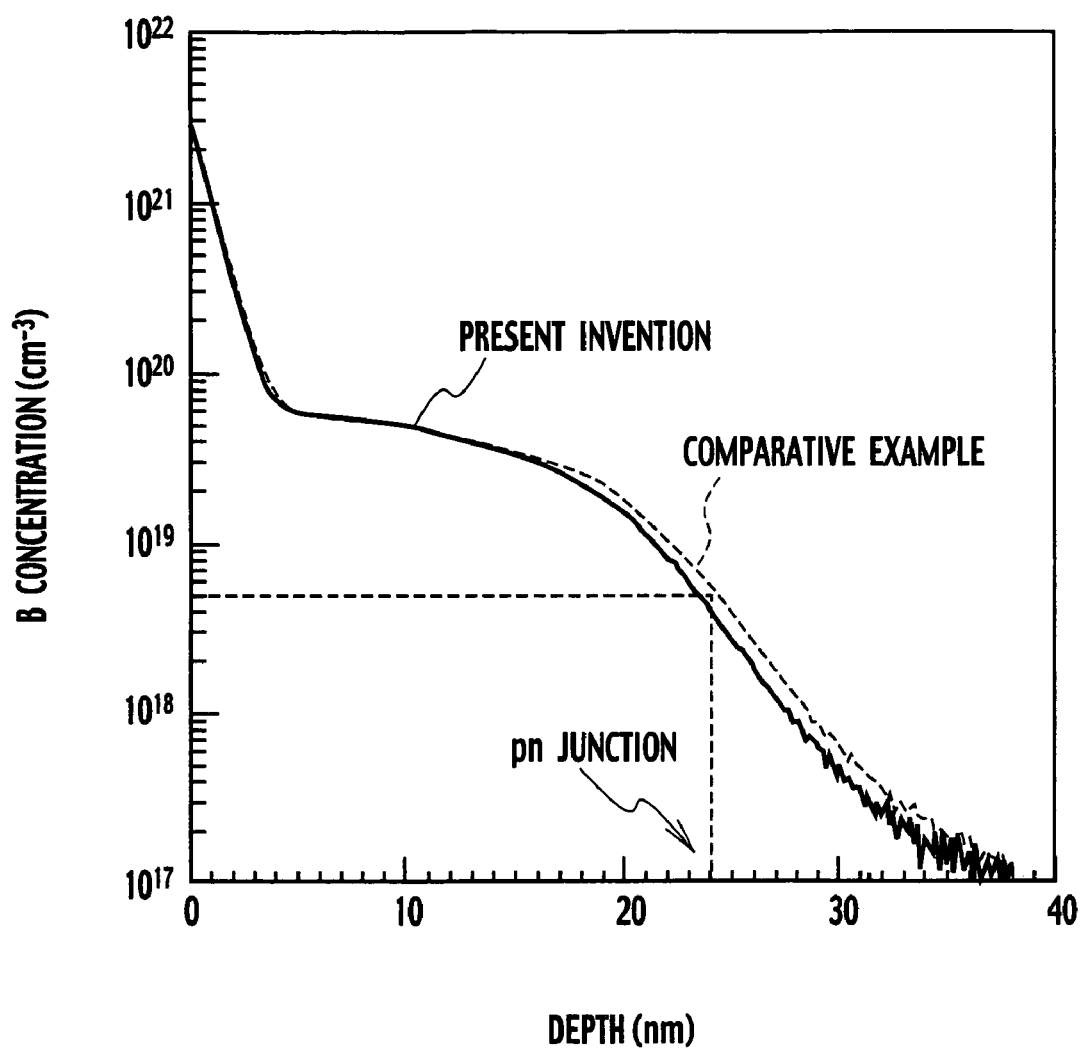
FIG. 15 is a graph illustrating boron concentration distribution of an impurity implanted region after spike RTA, formed by a doping method according to the embodiment of the present invention.

In a doping method according to the embodiment of the present invention, a flash lamp light is used in activation annealing of the impurity implanted regions 9 shown in FIG. 7. A B concentration distribution of the extension regions 11 is measured by SIMS in a case in which activation annealing of an impurity implanted region is executed by spike RTA using a halogen lamp, in place of a flash lamp light. The term "spike RTA" refers to an RTA process that eliminates the time to maintain the highest attained temperature. As a result of executing spike RTA at about 1050° C., the depth of a pn junction of the extension region is about 23 nm, as shown in FIG. 15. Compared to activation annealing of the impurity implanted regions 9 by the light of the flash lamp shown in FIG. 11, the depth of the pn junction is about twice as deep. As shown in FIG. 15, a B concentration distribution of an extension region is provided by applying spike RTA for an impurity implanted region of the comparative example. It can be affirmed that there is no difference in depth of pn junctions of about 24 nm between the extension regions of the embodiment of the present invention and the comparative example. Additionally, sheet resistances of the extension regions by the embodiment of the present invention and the comparative example also provide similar values of 1780 Ω/sq. and 1850 Ω/sq., respectively. In this manner, a shallow pn junction is not a phenomenon reliant on merely shallow impurity layers formed by beam line ion implantation or plasma source ion implantation. In a doping method according to the embodiment of the present invention, by activation annealing with an extremely short pulse width in a range of about 0.1 ms to about 100 ms using a flash lamp light, it is possible to form a shallow pn junction.

A manufacturing method for a semiconductor device according to the embodiment of the present invention will be described using a manufacturing process of a complimentary MOS (CMOS) transistor, which is a basic element of a semiconductor device, as an example. Further, the basic element of a described semiconductor device is not limited to a CMOS transistor. An element such as a p-MOS transistor or an n-MOS transistor is also possible. Additionally, a metal-insulator-semiconductor (MIS) transistor using an insulating film such as a silicon oxynitride (SiON) film, a silicon nitride ($Si_3N_4$) film, or a composite insulating film between a $SiO_2$ film and an SiON film, an $Si_3N_4$ film, a various metal oxide film or the like, instead of an $SiO_2$ film of a MOS transistor, is also possible.

Figure 16:
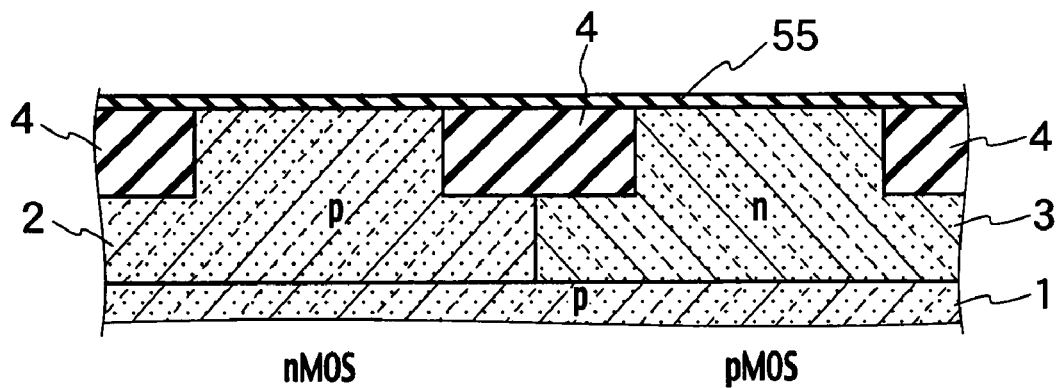
FIGS. 16 to 23 are cross sectional views showing an example of a manufacturing method of a semiconductor device according to the embodiment of the present invention.

As shown in FIG. 16, a p well layer 2 is formed in an nMOS region of the p-type Si semiconductor substrate 1, and an n-well 3 is formed in a pMOS region. An STI 4 as an isolation region is formed around the p well layer 2 and the n-well 3. The n-MOS and p-MOS regions which serve as element regions, are separated by the STI 4. Then, an insulating film 55, made of a material such as a thermal oxide film and the like, is formed on the surface of the semiconductor substrate 1.

Figure 17:
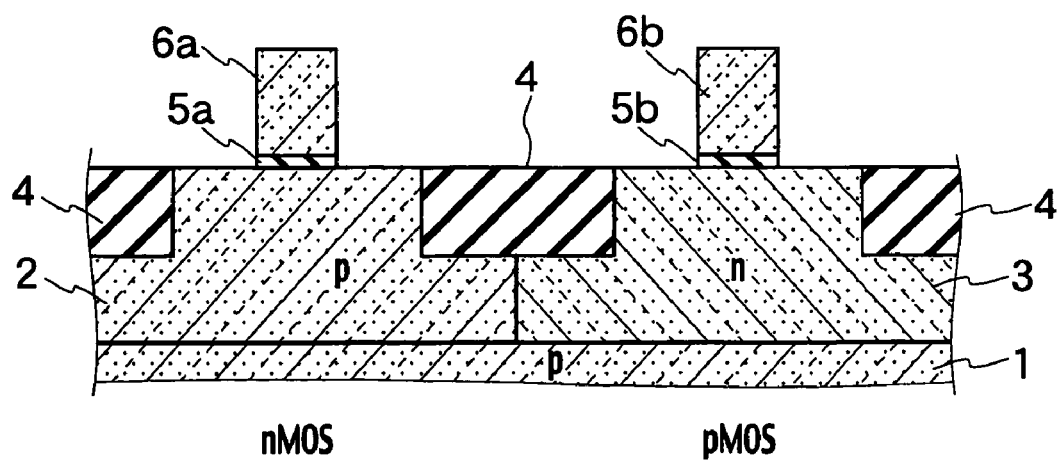

A poly-Si film is deposited on top of the insulating film 55 by LPCVD and the like. By photolithography, RIE and the like, the poly-Si film and the insulating film 55 are selectively removed, so as to form gate electrodes 6a, 6b and gate insulating films 5a, 5b in the nMOS region and the pMOS region, as shown in FIG. 17.

By photolithography and the like, a photoresist film 16a is formed to cover the pMOS region of the semiconductor substrate 1. Using the photoresist film 16a and the gate electrode 6a of the nMOS region as a mask, first impurity ions which do not contribute to electric conductivity of the semiconductor substrate 1, such as He ions, are implanted by plasma source ion implantation and the like. The first impurity ions have an atomic weight smaller than second impurity ions which contributes to the electric conductivity. Ion implantation conditions are an acceleration energy of about 100 eV and an implant dose of about $1\times10^{15}$ cm$^{-2}$. The He ions are implanted at a depth of about 10 nm from the surface of the semiconductor substrate 1, at a concentration of about $1\times10^{19}$ cm$^{-3}$ to about $1\times10^{21}$ cm$^{-3}$, for example.

Figure 18:
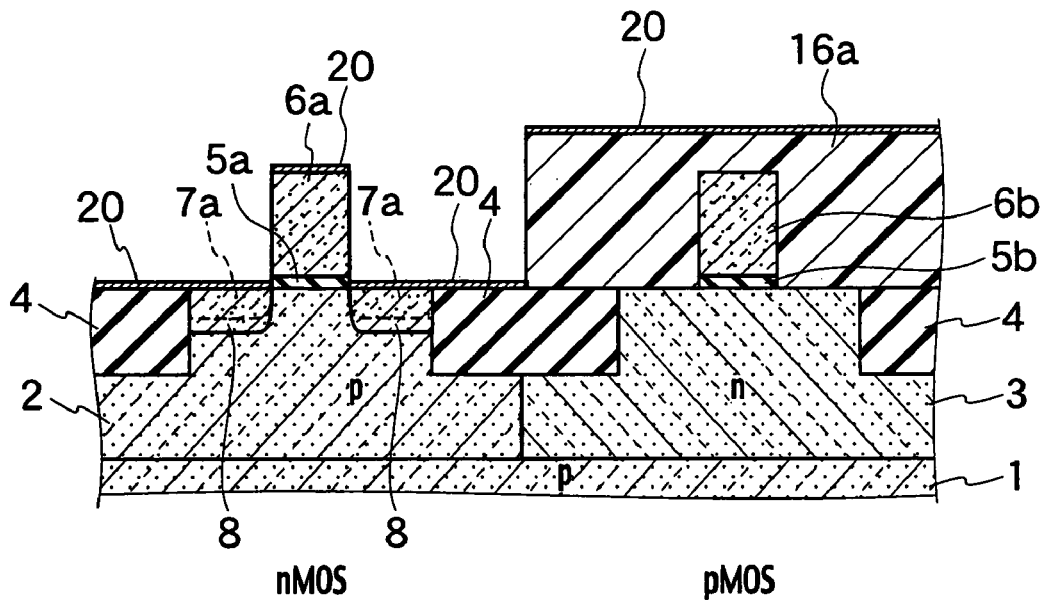

Using the photoresist film 16a and the gate electrode 6a of the nMOS region as a mask, ions of a group V element (n-type impurity ions) such as As ions, are implanted as the second impurity ions, by plasma source ion implantation using a plasma of an arsine gas (AsH$_3$) and the like. Ion implantation conditions are an acceleration energy of about 1 keV and a implant dose of $1\times10^{15}$ cm$^{-2}$, for example. The As ions are implanted at a depth of about 15 nm from the surface of the semiconductor substrate 1. By plasma source ion implantation of He and As, as shown in FIG. 18, damaged regions 7a and n-type impurity implanted regions 8 are formed between both ends of the gate insulating film 5a and the STI 4, at a depth of about 10 nm and about 15 nm respectively, from the surface of the semiconductor substrate 1. An impurity layer 20 deposited with As is formed on the surfaces of the semiconductor substrate 1, the gate electrode 6a, the STI 4, and the photoresist film 16a. Afterward, the photoresist film 16a is removed.

By photolithography and the like, a photoresist film 16b is formed to cover the nMOS region of the semiconductor substrate 1. Using the photoresist film 16b and the gate electrode 6b of the nMOS region as a mask, the first impurity ions, such as He ions, are implanted by plasma source ion implantation and the like. Ion implantation conditions are an acceleration energy of 100 eV and an implant dose of $1\times10^{15}$ cm$^{-2}$. The He ions are implanted at a depth of about 10 nm from the surface of the semiconductor substrate 1, at a concentration of about $1\times10^{19}$ cm$^{-3}$ to about $1\times10^{21}$ cm$^{-3}$, for example.

Figure 19:
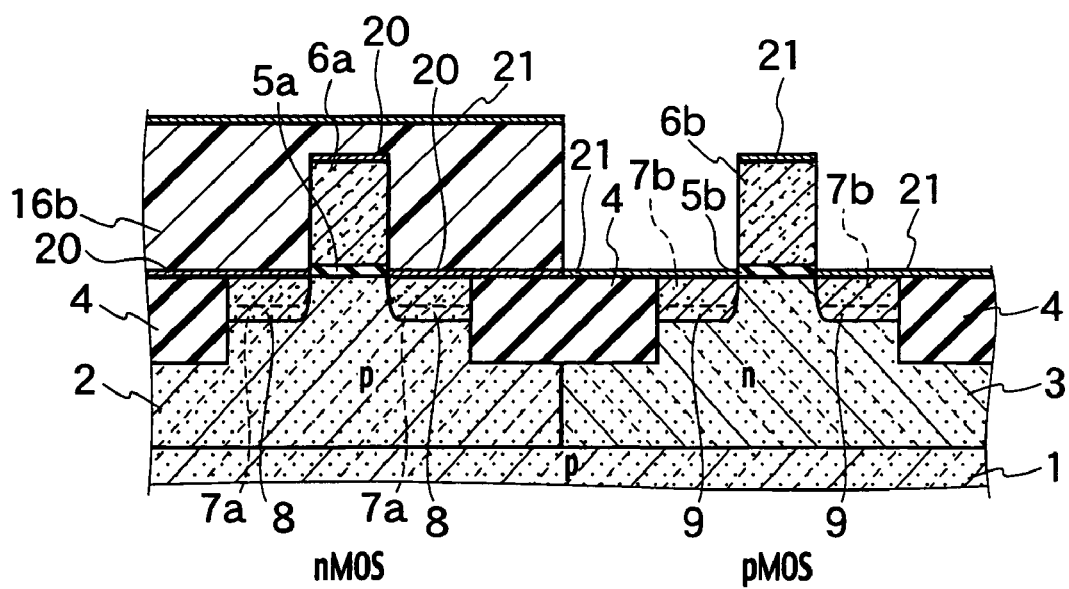

Using the photoresist film 16b and the gate electrode 6b of the nMOS region as a mask, p-type (group III element) ions such as B ions, are implanted as the second impurity ions, by plasma source ion implantation using a plasma of a B hydride gas and the like. Ion implantation conditions are an acceleration energy of about 200 eV and an implant dose of $1\times10^{15}$ cm$^{-2}$, for example. The B ions are implanted at a depth of about 15 nm from the surface of the semiconductor substrate 1. By plasma source ion implantation of He and B, as shown in FIG. 19, damaged regions 7b and p-type impurity implanted regions 9 are formed between both ends of the gate insulating film 5b and the STI 4, at a depth of about 10 nm and 15 nm respectively, from the surface of the semiconductor substrate 1. An impurity layer 21 deposited with B is formed on the surfaces of the semiconductor substrate 1, the gate electrode 6b, the STI 4, and the photoresist film 16b. Afterward, the photoresist film 16b is removed.

Figure 20:
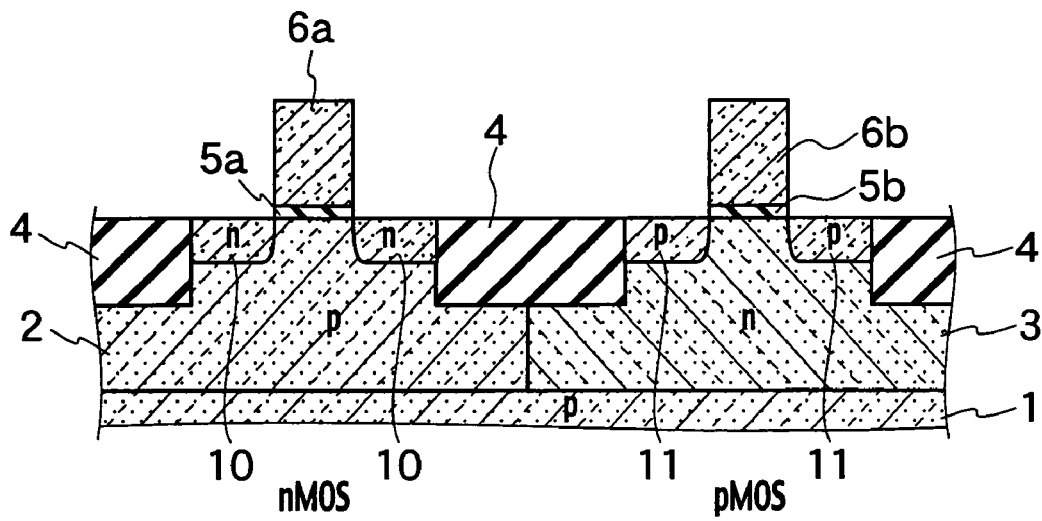

The semiconductor substrate 1 is placed on top of the susceptor 31 of the annealing apparatus shown in FIG. 1. The semiconductor substrate 1 is pre-heated from the bottom surface of the semiconductor substrate 1 to about 450° C. for example, by the heat source 32 of the susceptor 31. While maintaining a pre-heating temperature of about 450° C. on the semiconductor substrate 1, the surface of the semiconductor substrate 1 is irradiated with flash lamp light from the light source 38 with a pulse width of about 1 ms and an irradiation energy density of about 25 J/cm$^2$. By activation annealing, the B and As ions are moved to substitutional lattice sites and activated during recrystallization of the damaged regions 7a, 7b induced on the impurity implanted regions 8 and 9 by ion implantation. As a result, n-type extension regions 10 and p-type extension regions 11 are formed between both ends of the gate insulating films 5a, 5b and the STI 4, as shown in FIG. 20. Further, a part of the impurity layers 20, 21 deposited on surfaces of the semiconductor substrate 1, the gate electrodes 6a, 6b, and the STI 4, vaporize or diffuse into the extension regions 10, 11 during the activation annealing. The impurity layers 20, 21 remaining on surfaces are removed by wet etching or dry etching.

Figure 21:
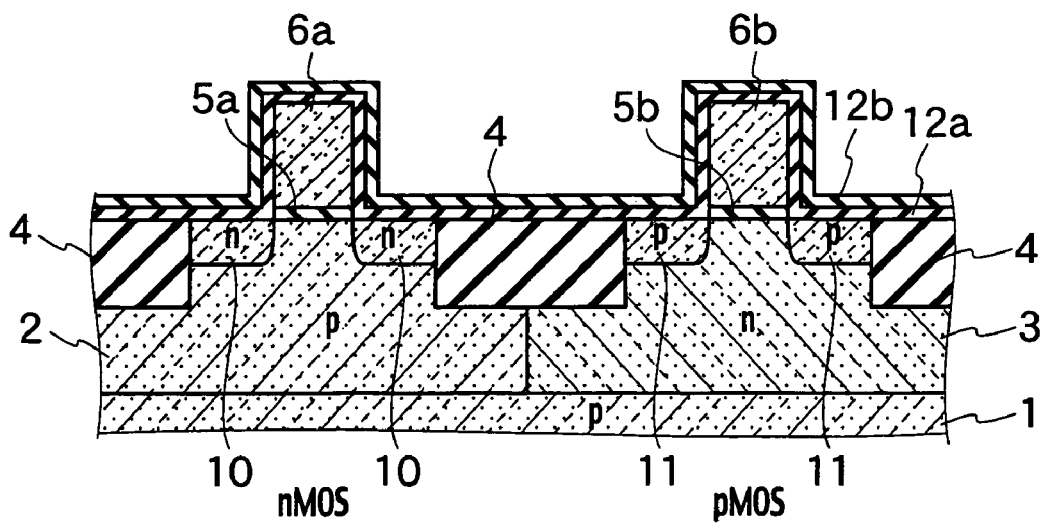
Figure 22:
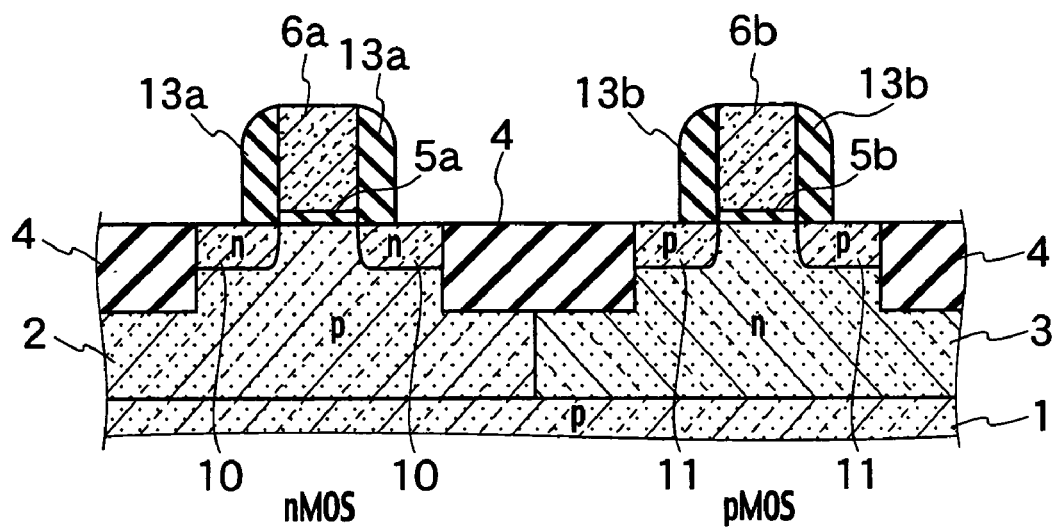

As shown in FIG. 21, a first insulating film 12a such as SiO$_2$, and a second insulating film 12b such as Si$_3$N$_4$, are sequentially deposited on top of the semiconductor substrate 1 by LPCVD. The first and second insulating films 12a, 12b are selectively removed by directional etching such as RIE and the like. As shown in FIG. 22, the first and second insulating films 12a, 12b are selectively left on sides of the gate electrodes 6a, 6b, and the gate insulating films 5a, 5b, to form multi-layered sidewall spacers 13a, 13b, of SiO$_2$ and Si$_3$N$_4$.

By photolithography and the like, a photoresist film is formed to cover the PMOS region. Using the gate electrode 6a and the sidewall spacer 13a as a mask, group V element ions, such as P ions, are selectively implanted into the nMOS region by beam line ion implantation, so as to form n-type source-drain impurity implanted regions. Ion implantation conditions are an acceleration energy of about 10 keV and an implant dose of about $3\times10^{15}$ cm$^{-2}$. The photoresist film on the pMOS region is removed. Then, by photolithography and the like, another photoresist film is formed to cover the nMOS region. Using the gate electrode 6b and the sidewall spacer 13b as a mask, group III element ions, such as B ions, are selectively implanted into the pMOS region by beam line ion implantation, so as to form p-type source-drain impurity implanted regions. Ion implantation conditions are an acceleration energy of about 4 keV and an implant dose of about $3\times10^{15}$ cm$^{-2}$. As a result, the impurity implanted regions implanted with P ions are formed in the nMOS region of the semiconductor substrate 1 between both ends of the sidewall spacer 13a and the STI 4 at a depth deeper than the extension regions 10. Similarly, the impurity implanted regions implanted with the B ions are formed in the pMOS region of the semiconductor substrate 1 between both ends of the sidewall spacer 13b and the STI 4 at a depth deeper than the extension regions 11. Additionally, the P ions are implanted into the gate electrodes 6a at the nMOS region, while B ions are implanted into the gate electrode 6b at the pMOS region.

Figure 23:
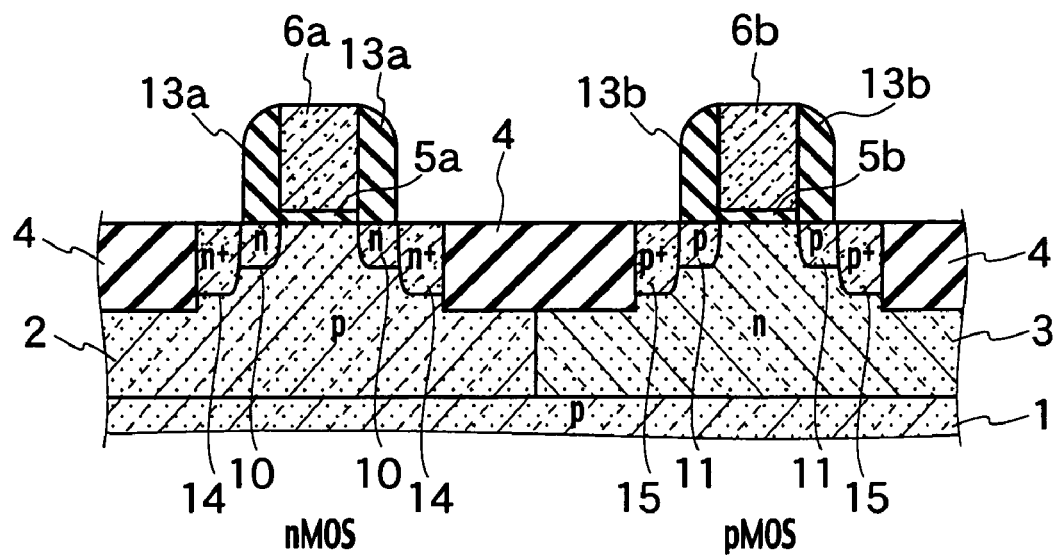

The semiconductor substrate 1 is placed on top of the susceptor 31 of the annealing apparatus shown in FIG. 1. The semiconductor substrate 1 is pre-heated from the bottom surface of the semiconductor substrate 1 to about 450° C. for example, by the heat source 32 of the susceptor 31. While maintaining a pre-heating temperature of about 450° C. on the semiconductor substrate 1, the top surface of the semiconductor substrate 1 is irradiated with flash lamp light from the light source 38 with a pulse width of 1 ms and irradiation energy density of about 25 J/cm$^2$. As a result, n$^+$ type source-drain regions 14 are formed between both ends of the sidewall spacer 13a and the STI 4, abutting the extension regions 10, as shown in FIG. 23. Similarly, p$^+$ type source-drain regions 15 are formed between both ends of the sidewall spacer 13b and the STI 4, abutting the extension regions 11.

An interlevel insulating film such as $SiO_2$, is deposited on the surface of the semiconductor substrate 1. Then, contact holes are opened in the interlevel insulating film above the gate electrodes 6a, 6b, and the source-drain regions 14, 15. Wiring is connected to the gate electrodes 6a, 6b, the source-drain regions 14, 15 through the contact holes. Thus, a semiconductor device is manufactured.

In a manufacturing method for a semiconductor device according to the embodiment of the present invention, the amorphized damaged regions 7a, 7b are formed by plasma source ion implantation of He. The fine irregularities are formed by sputtering on the surfaces of the impurity implanted regions 8, 9, the gate electrodes 6a, 6b, and the STI 4 are formed by the plasma source ion implantation. Additionally, the impurity layers 20, 21 are formed on the surfaces of the impurity implanted regions 8, 9, the gate electrodes 6a, 6b, and the STI 4. The absorption coefficient of the damaged regions 7a, 7b relative to the flash lamp light may be increased compared with a single crystal Si substrate. In addition, because the impurity layers 20, 21 are deposited on the surfaces of the impurity implanted regions 8, 9, the gate electrodes 6a, 6b, and the STI 4, each being of different materials, differences in flash lamp light absorption efficiency of the different materials becomes more even.

Furthermore, the fine irregularities formed on the surfaces of the impurity implanted regions 8, 9, the gate electrodes 6a, 6b, and the STI 4, have a pitch shorter than repeating patterns of the gate electrodes 6a, 6b and the STI 4. Incident light from the flash lamp passing through fine irregularities is scattered in random directions throughout the interiors of the impurity implanted regions 8, 9, the gate electrodes 6a, 6b, and the STI 4. Thus, the absorption coefficient of the impurity implanted regions 8, 9 relative to the flash lamp light is increased.

In activation annealing of the impurity ions implanted into the impurity implanted regions 8, 9, the irradiation energy density can be reduced to about 25 $J/cm^2$, which is less than a normally required irradiation energy density of about 30 $J/cm^2$ for a Si substrate. Due to the reduction in the irradiation energy, thermal stress arising from differences between thermal properties of different materials is suppressed. It is also possible to suppress formation of hotspots arising from interference of the flash lamp light incident to the semiconductor substrate 1. As a result, by suppressing crystal defects in the semiconductor substrate 1, it is possible to form a shallow pn junction.

In addition, the P and B ions, which are the impurity of the source-drain regions 14, 15, are implanted at high acceleration energies of about 15 keV and about 4 keV, by beam line ion implantation. Damaged regions are formed on the surfaces of the extension regions 10, 11 implanted with the P and B ions. In the damaged regions, the absorption coefficient for flash lamp light can be increased. Therefore, in activation annealing of the ions implanted to the source-drain regions 14, 15, the irradiation energy density can be reduced to about 25 $J/cm^2$, which is less than a normally required irradiation energy density of about 30 $J/cm^2$ for a Si substrate. Due to reduction in irradiation energy density, it is possible to suppress formation of hotspots arising from interference of the flash lamp light in the semiconductor substrate 1. In this manner, even in forming the source-drain regions 14, 15 by beam line ion implantation, it is possible to suppress generation of crystal defects in the semiconductor substrate 1, and to form a shallow pn junction. According to the embodiment of the present invention, it is possible to activate impurity ions implanted into the semiconductor substrate 1 at high temperatures, such as about 900° C. or more, in an extremely short time period. Therefore, impurity diffusion arising from activation annealing can be limited to a length of about 5 nm or less, and it is possible to form a shallow pn junction.

(Modification)

A manufacturing method for a semiconductor device according to a modification of the embodiment of the present invention will be described using a manufacturing process of a CMOS transistor. Further, the semiconductor device described is not limited to a CMOS transistor. A p-MOS transistor, an n-MOS transistor and the like, are also applicable. Additionally, a MIS transistor is also applicable.

In the modification of the embodiment of the present invention, the aspect in which source-drain regions are formed prior to extension regions, is different from the embodiment. Other aspects of the modification of the embodiment are identical to the embodiment. Thus, redundant description will be omitted thereof.

Figure 24:
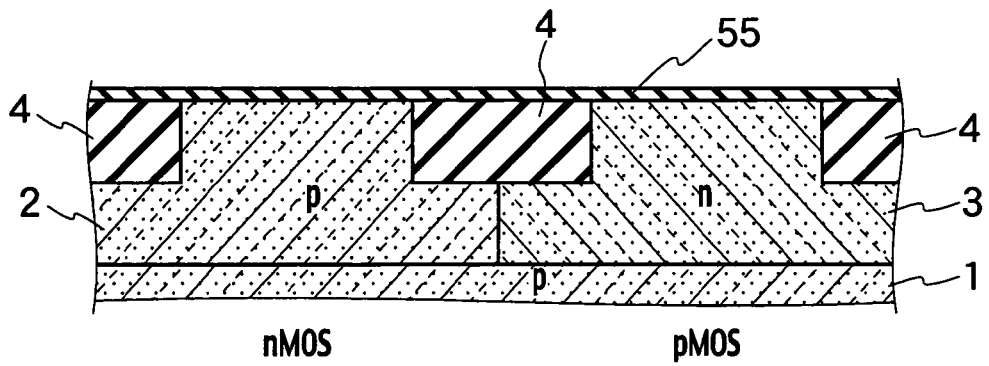
FIGS. 24 to 32 are cross sectional views showing an example of a manufacturing method of a semiconductor device according to a modification of the embodiment of the present invention.

As shown in FIG. 24, a p well layer 2 is formed in an nMOS region of the p-type Si semiconductor substrate 1, and an n-well 3 is formed in a pMOS region. An STI 4 is formed around the p well layer 2 and the n-well 3. The n-MOS and p-MOS regions which serve as element regions, are separated by the STI 4. Then, an insulating film 55, made of a material such as a thermal oxide film and the like, is formed on the surface of the semiconductor substrate 1.

Figure 25:
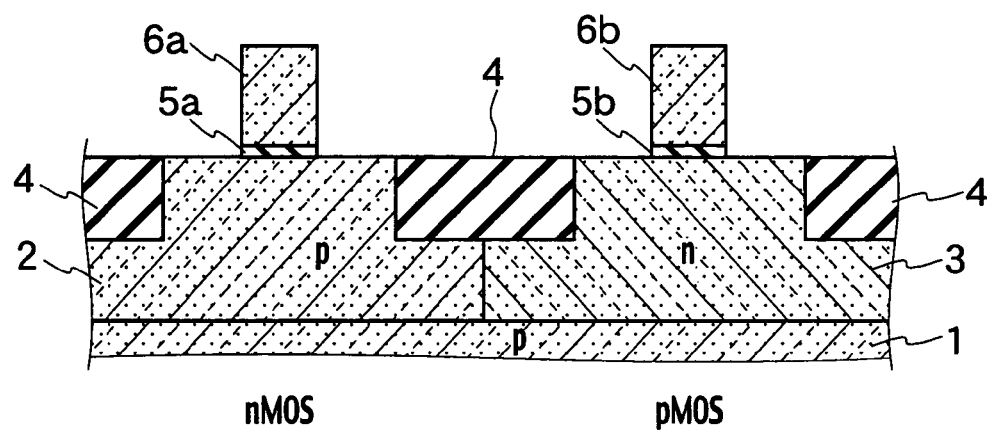

A poly-Si film is deposited on top of the insulating film 55 by LPCVD and the like. By photolithography, RIE and the like, the poly-Si film and the insulating film 55 are selectively removed, so as to form gate electrodes 6a, 6b and gate insulating films 5a, 5b in the nMOS region and the pMOS region, as shown in FIG. 25.

Figure 26:
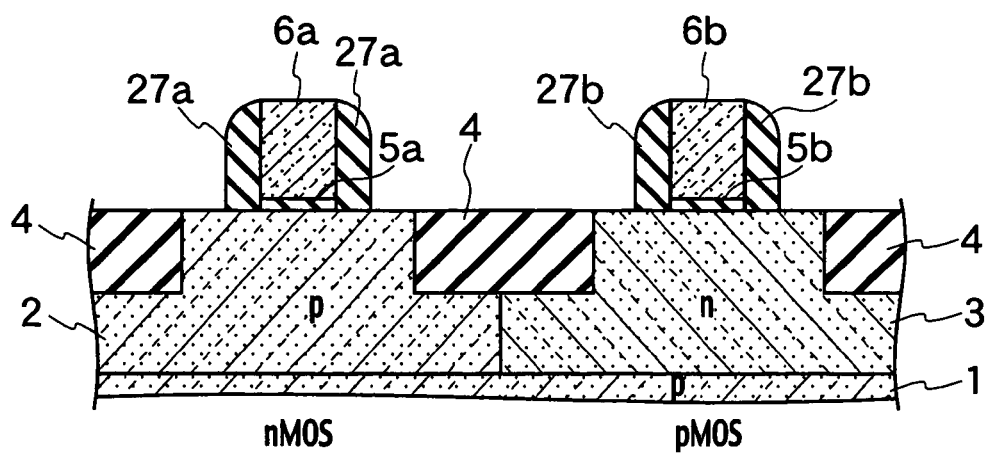

By LPCVD and the like, an insulating film such as $Si_3N_4$ is deposited on the surface of the semiconductor substrate 1. As shown in FIG. 26, the insulating film is selectively removed by directional etching such as RIE and the like, so as to form sidewall spacers 27a and 27b selectively remained on side surfaces of the gate electrodes 6a, 6b, and the gate insulating films 5a, 5b.

By photolithography and the like, a photoresist film is formed to cover the pMOS region. Using the gate electrode 6a and the sidewall spacer 27a as a mask, group V element ions such as P ions, are selectively implanted into the nMOS region by beam line ion implantation, so as to form n-type source-drain impurity implanted regions. Ion implantation conditions are an acceleration energy of about 10 keV and an implant dose of about $3\times10^{15}$ $cm^{-2}$. The photoresist film on the pMOS region is removed. Then, by photolithography and the like, another photoresist film is formed to cover the nMOS region. Using the gate electrode 6b and the sidewall spacer 27b as a mask, group III element ions, such as B ions, are selectively implanted into the pMOS region by beam line ion implantation, so as to form p-type source-drain impurity implanted regions. Ion implantation conditions are acceleration energy of about 4 keV and an implant dose of about $3\times10^{15}$ $cm^{-2}$. As a result, the impurity implanted regions implanted with the P and B ions are formed in the nMOS and pMOS regions of the semiconductor substrate 1 between both ends of the sidewall spacers 27a, 27b and the STI 4, respectively. Additionally, the P and B ions are implanted into the gate electrodes 6a and 6b at the nMOS and pMOS regions, respectively.

Figure 27:
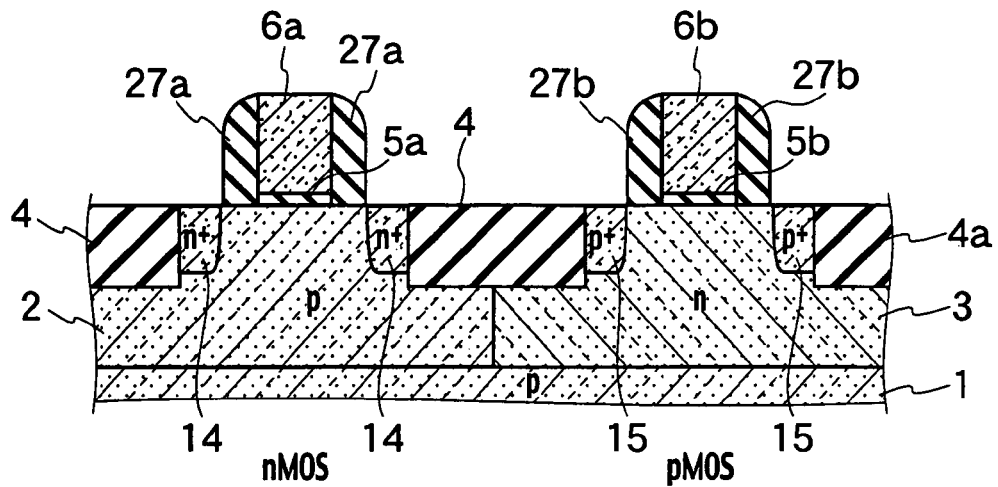

By spike RTA and the like, the P and B ions implanted in the impurity implanted regions and the gate electrode 6a, 6b are activated at a temperature of about 1000° C. As a result, $n^+$-type source-drain regions 14, and $p^+$-type source-drain regions 15 are formed between both ends of the sidewall spacer 27a, 27b and the STI 4, respectively, as shown in FIG. 27.

Figure 28:
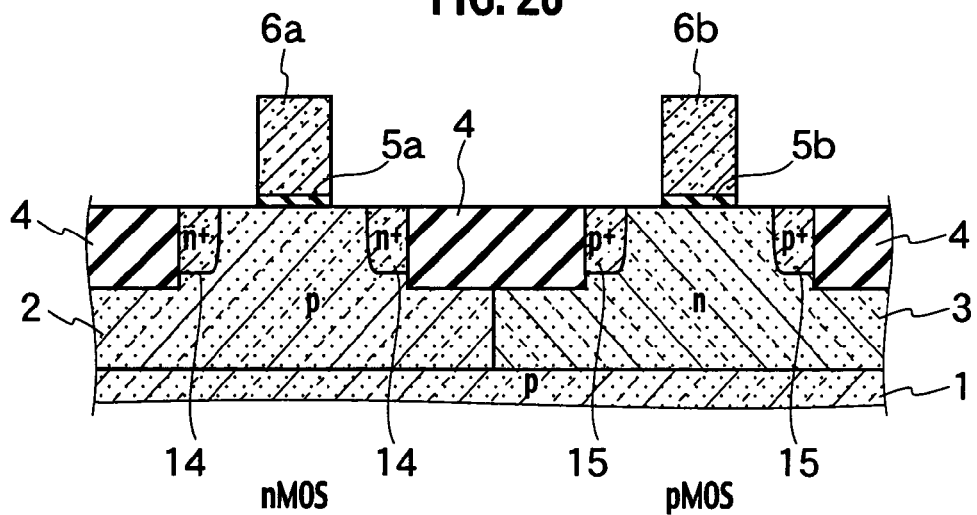

As shown in FIG. 28, by wet etching using a hot phosphoric acid solution and the like, the sidewall spacers 27a, 27b are selectively removed.

By photolithography and the like, a photoresist film is formed to cover the pMOS region. Using the photoresist film and the gate electrode 6a of the nMOS region as a mask, He ions and the like, are implanted by plasma source ion implantation and the like. Ion implantation conditions are an acceleration energy of about 100 eV and an implant dose of about $1 \times 10^{15}$ cm$^{-2}$. The He ions are implanted at a depth of about 10 nm from the surface of the semiconductor substrate 1, with a concentration of about $1 \times 10^{19}$ cm$^{-3}$ to about $1 \times 10^{21}$ cm$^{-3}$, for example.

Using the photoresist film and the gate electrode 6a of the nMOS region as a mask, As ions and the like, are implanted by plasma source ion implantation using a plasma of AsH$_3$ gas and the like. Ion implantation conditions are an acceleration energy of about 1 keV and a implant dose of $1 \times 10^{15}$ cm$^{-2}$. The As ions are implanted at a depth of about 15 nm from the surface of the semiconductor substrate 1.

Figure 29:
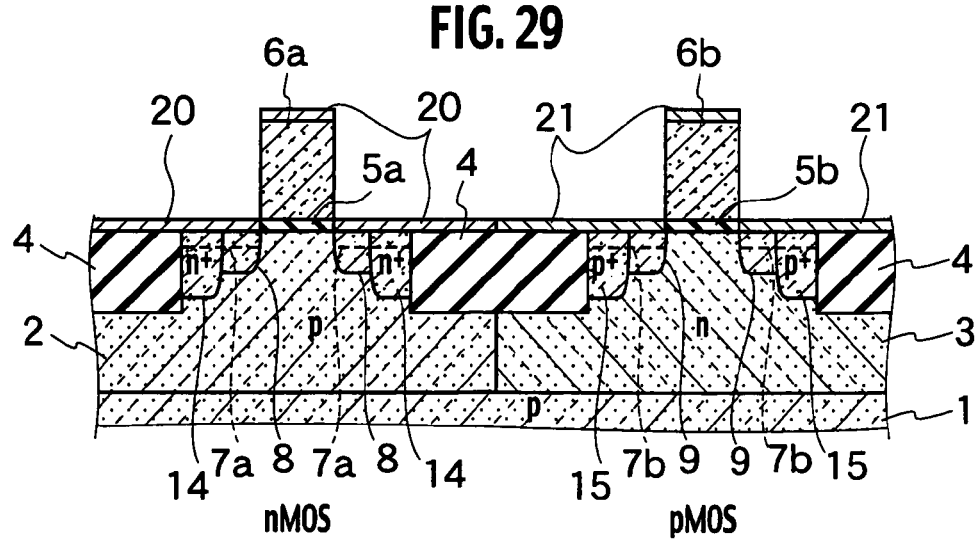

By plasma source ion implantation of He and As, as shown in FIG. 29, damaged regions 7a and n-type impurity implanted regions 8 are formed between both ends of the gate insulating film 5a and the STI 4, at a depth of about 10 nm and about 15 nm respectively, from the surface of the semiconductor substrate 1. A deposited As impurity layer 20 is formed on the surfaces of the semiconductor substrate 1, the gate electrode 6a, and the STI 4. Afterward, the photoresist film is removed.

By photolithography and the like, another photoresist film is formed to cover the nMOS region of the semiconductor substrate 1. Using the photoresist film and the gate electrode 6b of the nMOS region as a mask, He ions and the like, are implanted by plasma source ion implantation and the like. Ion implantation conditions are an acceleration energy of 100 eV and an implant dose of $1 \times 10^{15}$ cm$^{-2}$. The He ions are implanted at a depth of about 10 nm from the surface of the semiconductor substrate 1, with a concentration of about $1 \times 10^{19}$ cm$^{-3}$ to about $1 \times 10^{21}$ cm$^{-3}$, for example.

Using the photoresist film 16b and the gate electrode 6b of the nMOS region as a mask, B ions and the like, are implanted by plasma source ion implantation using a plasma of B hydride gas and the like. Ion implantation conditions are an acceleration energy of about 200 ev and an implant dose of $1 \times 10^{15}$ cm$^{-2}$, for example. The As ions are implanted at a depth of about 15 nm from the surface of the semiconductor substrate 1.

By plasma source ion implantation of He and B, as shown in FIG. 29, damaged regions 7b and p-type impurity implanted regions 9 are formed between both ends of the gate insulating film 5b and the STI 4, at a depth of about 10 nm and 15 nm respectively, from the surface of the semiconductor substrate 1. A deposited B impurity layer 21 is formed on the surfaces of the semiconductor substrate 1, the gate electrode 6b, and the STI 4. Afterward, the photoresist film is removed.

Figure 30:
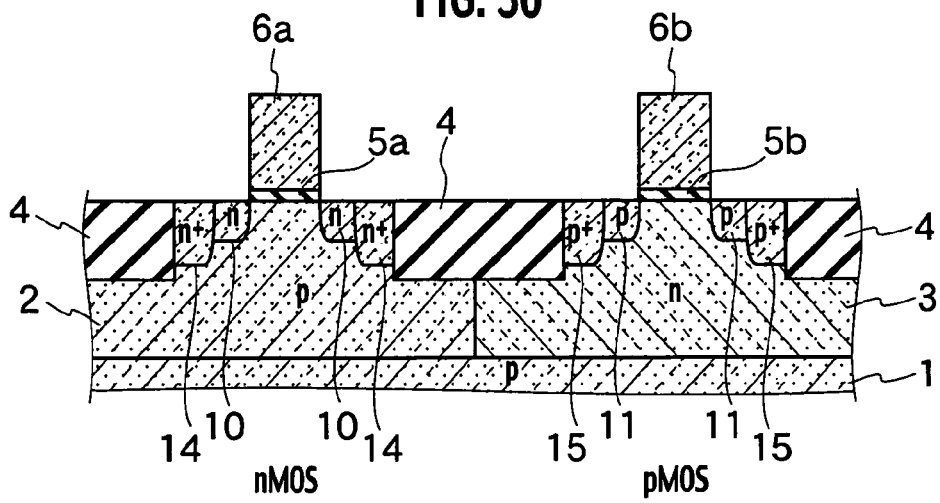

The semiconductor substrate 1 is placed on top of the susceptor 31 of the annealing apparatus shown in FIG. 1. The semiconductor substrate 1 is pre-heated from the bottom surface of the semiconductor substrate 1 to about 450° C. for example, by the heat source 32 of the susceptor 31. While maintaining a pre-heating temperature of about 450° C. on the semiconductor substrate 1, the surface of the semiconductor substrate 1 is irradiated with flash lamp light from the light source 38 with a pulse width of about 1 ms and an irradiation energy density of about 25 J/cm$^2$. By activation annealing, the B and As ions are moved to substitutional lattice sites and activated during recrystallization of the damaged regions 7a, 7b induced on the impurity implanted regions 8 and 9 by ion implantation. As a result, an n-type extension regions 10 and a p-type extension regions 11 are formed between both ends of the gate insulating films 5a, 5b and the STI 4, respectively, as shown in FIG. 30. Further, a part of the impurity layers 20, 21 deposited on surfaces of the semiconductor substrate 1, the gate electrodes 6a, 6b, and the STI 4, vaporize or diffuse into the extension regions 10, 11 during the activation annealing. The impurity layers 20, 21 remaining on surfaces are removed by wet etching or dry etching.

Figure 31:
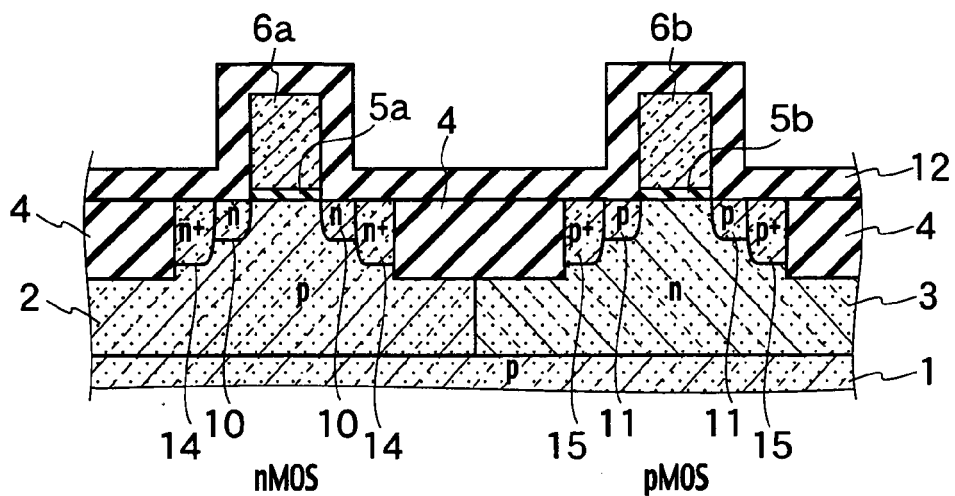
Figure 32:
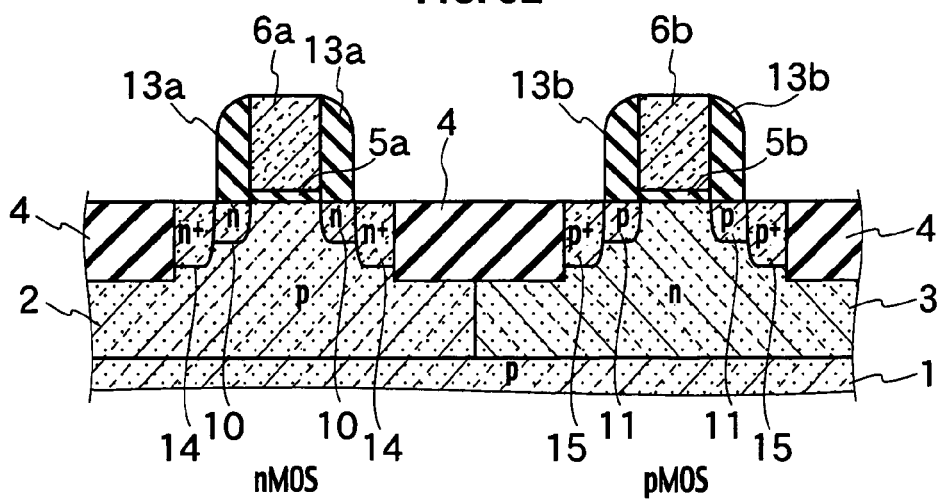

As shown in FIG. 31, an insulating film 12 such as Si$_3$N$_4$, is deposited on top of the semiconductor substrate 1 by LPCVD. The insulating film 12 is selectively removed by directional etching such as RIE and the like. As shown in FIG. 32, the insulating film 12 is selectively remained on side surfaces of the gate electrodes 6a, 6b, and the gate insulating films 5a, 5b, to form sidewall spacers 13a, 13b.

By sputter and the like, a metal film such as nickel (Ni) is deposited on top of the semiconductor substrate 1. By RTA and the like, silicidation of the deposited metal film is implemented on the surfaces of the gate electrodes 6a, 6b and the source-drain regions 14, 15, which are disposed between the STI 4 and the sidewall spacers 13a, 13b. By wet etching and the like, unreacted Ni is removed. An interlevel insulating film such as SiO$_2$, is deposited on the surface of the semiconductor substrate 1. Then, contact holes are opened in the interlevel insulating film above the gate electrodes 6a, 6b, and the source-drain regions 14, 15. Wiring is connected to the gate electrodes 6a, 6b, the source-drain regions 14, 15 through the contact holes. Thus, a semiconductor device is manufactured.

In a manufacturing method for a semiconductor device according to the modification of the embodiment of the present invention, it is possible to suppress generation of crystal defects in the semiconductor device 1, and to form a shallow pn junction. As a result, it may be possible to manufacture a semiconductor device with a high uniformity and a high yield rate.

Additionally, in the source-drain regions 14, 15 formed by the deep impurity implanted regions, it is rather difficult to recover crystal defects produced by ion implantation, using an extremely rapid annealing such as flash lamp annealing. Especially, dislocations or stacking faults remain around the pn junctions of the source-drain regions, since heat provided by the extremely rapid annealing cannot be transferred to the deep pn junctions. It may be possible to recover crystal defects by increasing an irradiation energy density of the flash lamp light. However, increase of the irradiation energy density generates damage such as slip, dislocation and the like, so as to decrease a manufacturing yield rate of a semiconductor device.

Therefore, prior to formation of the shallow pn junction of the extension regions 10, 11, activation of the source-drain regions 14, 15 is executed by spike RTA so as to recover crystal defects produced by ion implantation. Since thermal diffusion of the implanted ions is not a serious problem in the deep source-drain regions 14, 15, spike RTA which needs a rather long annealing duration, compared with flash lamp annealing, can be used.

After forming the source-drain regions 14, 15, the extension regions 10, 11 which are shallower in depth than the source-drain regions 14, 15, are formed. Since thermal diffusion may be a serious problem in the shallow extension regions 10, 11, extremely rapid annealing is desirable as activation annealing, instead of spike RTA and the like. The impurity implanted regions 8, 9 are shallow, as shown in FIG. 29. Therefore, even by extremely rapid annealing, heat can be transferred to all the impurity implanted regions 8, 9. As a result, it may be possible to recover crystal defects produced around the pn junctions of the impurity implanted regions 8, 9. Thus, it is possible to activate ions of the implanted impurity to a high concentration with decreased crystal defects in the source-drain regions 14, 15 and the extension regions 10, 11, so as to improve the transistor performance.

Other Embodiments

In the embodiment of the present invention, He ions are implanted as the first impurity atoms which do not contribute to electric conductivity of the semiconductor substrate 1. However, the first impurity atoms are not limited to He atoms. Other impurity atom such as hydrogen (H) atom, nitrogen (N) atom, fluoride (F) atom, neon (Ne) atom and the like, which has anatomic weight less than an n-type impurity atom or a p-type impurity atom and does not contribute to electric conductivity, may be used. Especially, H having a large diffusion coefficient in the silicon crystal as does He, is well suited as a first impurity.

Additionally, in the description of the embodiment of the present invention, a Xe flash lamp is used as the light source 38 shown in FIG. 1. However, the light source 38 is not limited to a Xe flash lamp. As the light source 38, a flash lamp using a gas, such as other noble gases, mercury (Hg), hydrogen, and the like, which can emit a high intensity light, may be used. Additionally, as the light source 38, a laser light, which can emit a coherent high intensity light, may be used.

Various modifications will become possible for those skilled in the art after storing the teachings of the present disclosure without departing from the scope thereof.

What is claimed is:

1. A doping method, comprising:
   implanting first impurity ions into a semiconductor substrate by a plasma source ion implantation to form a damaged region in the vicinity of a surface of the semiconductor substrate, the first impurity ions not contributing to electric conductivity of the semiconductor substrate;
   forming an irregularity on the surface of the semiconductor substrate by sputtering the surface of the semiconductor substrate in the plasma source ion implantation;
   implanting second impurity ions into the semiconductor substrate through the damaged region, the second impurity ions having an atomic weight larger than the first impurity ions and contributing to the electric conductivity; and
   heating the surface of the semiconductor substrate with a flash lamp light having a pulse width of about 0.1 ms to about 100 ms to activate the second impurity ions,
   wherein a pitch of the irregularity is less than a peak wavelength of the flash lamp light.

2. The doping method of claim 1, wherein the second impurity ions are implanted by a plasma source ion implantation.

3. The doping method of claim 2, wherein the second impurity ions are deposited on the surface of the semiconductor substrate.

4. The doping method of claim 1, wherein the first impurity ions are helium ions.

5. The doping method of claim 1, wherein the first impurity ions are hydrogen ions.

6. The doping method of claim 1, wherein the damaged region is amorphized.

7. The doping method of claim 1, wherein the semiconductor substrate is irradiated by the flash lamp light while maintaining a temperature of the semiconductor substrate in a range of about 300° C. to about 600° C.

8. The doping method of claim 1, wherein an implanted depth of the first impurity ions from the surface of the semiconductor substrate is less than an implanted depth of the second impurity ions.

9. A manufacturing method of a semiconductor device, comprising:
   forming an isolation region on a semiconductor substrate that separates a first element region from a second element region;
   depositing a gate insulating film on top of the first and second element region;
   forming a gate electrode on top of the gate insulating film;
   implanting first impurity ions using the gate electrode as a mask by a plasma source ion implantation to form damaged regions in the vicinity of a surface of the semiconductor substrate between the gate insulating film and the isolation region, the first impurity ions not contributing to electric conductivity of the semiconductor substrate;
   forming an irregularity on the surface of the semiconductor substrate by sputtering the surface of the semiconductor substrate in the plasma source ion implantation;
   implanting second impurity ions into the semiconductor substrate through the damaged regions, the second impurity ions having an atomic weight larger than the first impurity ions and contributing to the electric conductivity; and
   heating the surface of the semiconductor substrate with a flash lamp light having a pulse width of from 0.1 milliseconds to 100 milliseconds to form extension regions of source-drain by activating the second impurity ions,
   wherein a pitch of the irregularity is less than a peak wavelength of the flash lamp light.

10. The manufacturing method of claim 9, wherein the second impurity ions are implanted by a plasma source ion implantation.

11. The manufacturing method of claim 10, wherein the second impurity ions are deposited on the surface of the semiconductor substrate.

12. The manufacturing method of claim 9, wherein the first impurity ions are helium ions.

13. The manufacturing method of claim 9, wherein the first impurity ions are hydrogen ions.

14. The manufacturing method of claim 9, wherein the damaged region is amorphized.

15. The manufacturing method of claim 9, wherein the semiconductor substrate is irradiated by the flash lamp light while maintaining a temperature of the semiconductor substrate in a range of about 300° C. to about 600° C.

16. The manufacturing method of claim 9, further comprising:
   before implanting the first impurity ions, forming a sidewall spacer on side surfaces of the gate electrode and the gate insulating film; and
   implanting third impurity ions into the semiconductor substrate using the gate electrode and the sidewall spacer as a mask, the third impurity ions contributing to the electric conductivity.

17. The method of claim 16, further comprising, after forming the extension regions, forming another sidewall spacer on side surfaces of the gate electrode and the gate insulating film.

18. The manufacturing method of claim 9, wherein an implanted depth of the first impurity ions from the surface of the semiconductor substrate is less than an implanted depth of the second impurity ions.

* * * * *